US008247273B2

(12) United States Patent
Makita et al.

(10) Patent No.: US 8,247,273 B2
(45) Date of Patent: Aug. 21, 2012

(54) SEMICONDUCTOR DEVICE PROVIDED WITH THIN FILM TRANSISTOR AND METHOD FOR MANUFACTURING THE SEMICONDUCTOR DEVICE

(75) Inventors: Naoki Makita, Osaka (JP); Masato Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 421 days.

(21) Appl. No.: 12/667,465

(22) PCT Filed: Jun. 5, 2008

(86) PCT No.: PCT/JP2008/001435
§ 371 (c)(1),
(2), (4) Date: Dec. 31, 2009

(87) PCT Pub. No.: WO2009/011084
PCT Pub. Date: Jan. 22, 2009

(65) Prior Publication Data
US 2010/0181575 A1    Jul. 22, 2010

(30) Foreign Application Priority Data
Jul. 17, 2007 (JP) .................................. 2007-185909

(51) Int. Cl.
*H01L 21/00* (2006.01)
(52) U.S. Cl. .......................................... 438/149; 257/72
(58) Field of Classification Search .................. 257/72, 257/204, E27.046, E27.108, E21.632; 438/199, 438/149
See application file for complete search history.

(56) References Cited

U.S. PATENT DOCUMENTS

| 6,030,875 | A | * | 2/2000 | May et al. ..................... 438/302 |
| 7,833,845 | B2 | * | 11/2010 | Yamazaki et al. ............ 438/149 |
| 7,838,347 | B2 | * | 11/2010 | Suzawa et al. ................ 438/151 |
| 7,875,506 | B2 | * | 1/2011 | Sasagawa et al. ............. 438/149 |
| 2002/0192931 | A1 | | 12/2002 | Hayakawa |

FOREIGN PATENT DOCUMENTS

| JP | 2003-45858 A | 2/2003 |
| JP | 2005-209978 A | 8/2005 |
| JP | 2005-340377 A | 12/2005 |

* cited by examiner

*Primary Examiner* — Thao Le
(74) *Attorney, Agent, or Firm* — Birch, Stewart, Kolasch & Birch LLP

(57) ABSTRACT

A semiconductor device includes at least one thin-film transistor 116, which includes: a crystalline semiconductor layer 120 including a region 110 to be a channel region and source and drain regions 113; a gate electrode 107 for controlling the conductivity of the region 110 to be a channel region; a gate insulating film 106 arranged between the semiconductor layer 120 and the gate electrode 107; and source and drain electrodes 115 connected to the source and drain regions 113, respectively. At least one of the source and drain regions 113 contains an element to be a donor or an acceptor and a rare-gas element, but the region 110 to be a channel region does not contain the rare-gas element. The atomic weight of the rare-gas element is greater than that of the element to be a donor or an acceptor. The concentration of the rare-gas element in the at least one region as measured in the thickness direction thereof decreases continuously from the upper surface of the at least one region toward its lower surface.

30 Claims, 13 Drawing Sheets

→ CONCENTRATION OF GROUP IV ELEMENT OR RARE-GAS ELEMENT

FIG.3
(A)
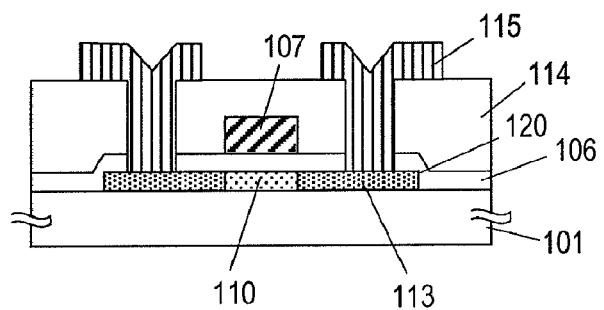
(B)
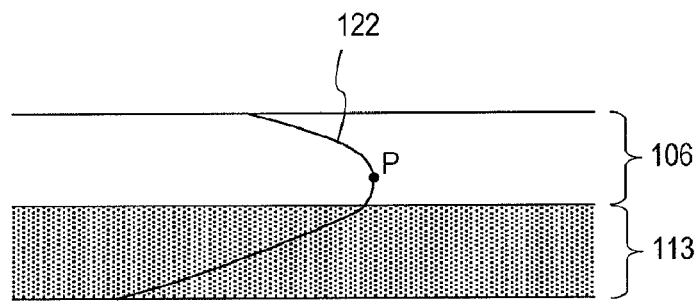
→ CONCENTRATION OF RARE-GAS ELEMENT

SEMICONDUCTOR DEVICE PROVIDED WITH THIN FILM TRANSISTOR AND METHOD FOR MANUFACTURING THE SEMICONDUCTOR DEVICE

TECHNICAL FIELD

The present invention relates to a semiconductor device including a thin-film transistor and a method for fabricating such a device.

BACKGROUND ART

A thin-film transistor (TFT) is used as a switching element to be provided for not only each pixel in the display area of an active-matrix-addressed LCD but also its driver circuit as well. In the driver circuit, in particular, a CMOS (complementary metal oxide semiconductor) circuit is usually formed by two TFTs of mutually different conductivity types. In those applications, the TFTs should have even better performance and operate at even higher response speeds.

A conventional TFT, however, has rather high source-drain resistance, which is one of the factors causing deterioration in its device performance.

The source/drain regions of a TFT are usually defined by implanting dopant ions into a semiconductor film by ion doping process and then performing a heat treatment process to activate the ions implanted (which will be referred to herein as an "activating annealing process"). The activating annealing process is carried out to not only activate the ions of the element that have been implanted into the semiconductor film but also recover the degree of crystallinity that has decreased by going through the ion implantation process.

Examples of techniques for getting the activating annealing done include an annealing process using a normal furnace, a rapid thermal annealing (RTA) process, and a laser annealing process that uses a laser beam such as an excimer laser beam. The RTA process may be carried out either by using a UV or IR lamp or by increasing or decreasing the temperature of a substrate instantaneously by spraying a high-temperature inert gas onto the surface of the substrate.

Among these techniques, the furnace annealing process can be adopted if the substrate is a small glass motherboard but is difficult to apply to a situation where a glass substrate in as big a size as of more than 500 mm square is used. This is because the furnace annealing process usually causes a lot of thermal damage that would make the substrate shrink under the heat. On the other hand, the activation by laser annealing process uses the melting and solidifying process, and therefore, can activate the ions implanted efficiently. However, the laser annealing system itself is too expensive and complicated to ensure good stability in the manufacturing process. That is why considering the productivity and manufacturing cost, such an expensive and complicated system should not be used as a matter of principle unless it is absolutely necessary to use it to crystallize a semiconductor film, for example. For these reasons, as for low temperature polysilicon TFTs that are currently manufactured by a number of companies using a big glass substrate as a motherboard, the activation is usually done by RTA process. Nevertheless, if the activation is done by RTA annealing process, it is so difficult to activate the added element to be an acceptor efficiently enough as carriers in a p-type region, in particular, that only approximately 10% of the element can function as carriers according to current technologies.

Thus, according to the conventional method of defining source/drain regions, the element that has been added to the source/drain regions of a completed TFT has not been activated sufficiently and most of them cannot function as carriers (as is often the case with a p-channel TFT, among other things), thus increasing the source-drain resistance. If a lot of element to be donors and acceptors were added to the source/drain regions, then the resistance of the source/drain regions could be reduced, even though the degree of activation would still be low. But the productivity might decline in that case. On top of that, if a lot of dopant element were introduced, then the crystallinity of the semiconductor film could decrease too much to recover sufficiently by any kind of activating annealing process.

To overcome these problems, Patent Document No. 1 discloses a technique for defining source/drain regions by adding either a Group V element or a rare-gas element to a polycrystalline semiconductor film to turn it into an amorphous one, implanting ions of a dopant into the film to give it a predetermined conductivity type, and then activating the dopant ions by annealing process. According to this technique, crystallization of an amorphous phase can be used during the activating annealing process, and therefore, the dopant ions that have been implanted into the source/drain regions can be activated to a higher degree than what can be achieved by any other conventional technique.

Patent Document No. 1 also proposes that by adding either a Group IV element or a rare-gas element, only an upper portion of the semiconductor film be amorphized with the remaining lower portion thereof kept polycrystalline. According to such a technique, it says, the crystal grains that are present in the lower portion of the semiconductor film can be seed crystals, and therefore, the semiconductor film could recover a sufficiently high degree of crystallinity.

Hereinafter, such a technique for defining source/drain regions as taught by Patent Document No. 1 will be described with reference to FIGS. 1(A) through 1(C).

First, as shown in FIG. 1(A), ions 3 of a Group IV element or a rare-gas element are implanted into an upper portion of a polycrystalline Group IV semiconductor film 4 on the surface of a substrate 1. As a result, only that upper portion of the semiconductor film 4 gets amorphized to be an amorphous semiconductor layer 2A, while the lower portion of the semiconductor film 4 remains polycrystalline to be a polycrystalline semiconductor layer 2B.

Next, as shown in FIG. 1(B), the semiconductor film 4 is patterned into islands 4' of semiconductor layer, and then a gate insulating film 9 and a gate electrode 10 are formed on each island 4' of semiconductor layer. Thereafter, ions 5 of a dopant element to give a predetermined conductivity type are implanted into portions of each island 4' of semiconductor layer to be source/drain regions.

Subsequently, as shown in FIG. 1(C), an activating annealing process is carried out to activate the dopant ions 5 implanted and recover the crystallinity of the islands 4' of semiconductor layer using the semiconductor layer 2B as a seed crystal. In this manner, an island 6 of crystalline semiconductor layer is obtained. Those portions of the island of crystalline semiconductor layer 6 that have been implanted with the dopant ions 5 will be source/drain regions 7, while the other portion that has been masked with the gate electrode 10 and has not been implanted with the dopant ions 5 becomes a channel region 11.

Patent Document No. 1 discloses that defects may remain as residual defects in the region 8 to be an interface between the semiconductor layers 2A and 2B but that it is possible to prevent leakage current from flowing due to the presence of those residual defects by implanting the dopant ions 5 deeper beyond the region 8. In this case, "to implant the dopant ions 5 deeper beyond the region 8" means implanting the dopant ions 5 under such conditions that the depth of the region 8 will fall within the depth range of the dopant ions 5 that are implanted into the island 6 of crystalline semiconductor layer (i.e., so that the region 8 will form part of the portion of the island 6 of crystalline semiconductor layer that has been implanted with the dopant ions 5 (which will be referred to herein as an "dopant implanted region")).

Patent Document No. 1: Japanese Patent Application Laid-Open Publication No. 2005-209978

DISCLOSURE OF INVENTION

Problems to be Solved by the Invention

However, the present inventors discovered and confirmed via experiments that the island of crystalline semiconductor layer 6 obtained by the technique shown in FIG. 1 could not have a degree of crystallinity that was high enough to reduce the resistance in the source/drain regions 7 sufficiently.

The concentration profile in the thickness direction of the Group IV element or rare-gas element 3 that has been added to the island 4' of semiconductor layer would have a peak (i.e., a local maximum of the concentration) inside the island 4' of semiconductor layer as shown in FIG. 2. That is why the degree of crystallinity of the island 4' of semiconductor layer will have decreased significantly over the depth of that peak (which will be referred to herein as a "peak depth"). If an activating annealing process is carried out in such a state, the island 4' of semiconductor layer will get crystallized upward from the polycrystalline semiconductor layer 2B, which forms the lower portion of the island 4' of semiconductor layer, as a seed crystal. In that case, the island 6 of crystalline semiconductor layer obtained by crystallization process will have a high degree of crystallinity in the lower portion of the island 6 of crystalline semiconductor layer because that portion has recovered its crystallinity sufficiently there, but will still have a low degree of crystallinity in the upper portion over the peak depth because that portion has failed to recover its crystallinity sufficiently.

As can be seen, by amorphizing the semiconductor film 4 with the addition of the Group IV element or rare-gas element 3, the dopant ions implanted 5 can be certainly activated more efficiently and the carrier density can be somewhat increased. However, it is still difficult to sufficiently recover the crystallinity of such a portion that has been amorphized by going through the activating annealing process. As a result, the mobility of carriers in the semiconductor film cannot be increased sufficiently. Since the resistance in the source/drain regions is inversely proportional to the product of the mobility and the carrier density, the resistance in the source/drain regions cannot be reduced as a result.

Furthermore, the channel region 11 that has been defined by the method shown in FIG. 1 also forms part of the region that has been once amorphized by implanting ions of a Group IV element or rare-gas element 3 into the semiconductor film 4 and then re-crystallized by going through the activating annealing process. Consequently, the degree of crystallinity of the channel region 11 becomes lower than that of the semiconductor film 4, and therefore, a TFT, of which the field effect mobility and/or ON/OFF ratio are/is high enough to realize operation at high response speeds, cannot be obtained. On top of that, residual defects that would remain in a lower portion of the channel region 11 would deteriorate the performance of the TFT, too.

It is therefore an object of the present invention to reduce the resistance in the source/drain regions of a thin-film transistor by increasing the degree of crystallinity in both the source/drain regions and a region to be a channel region and by activating the dopant element that has been added to the source/drain regions more efficiently.

Means for Solving the Problems

A semiconductor device according to the present invention includes at least one thin-film transistor. The transistor includes: a substrate; a crystalline semiconductor layer, which has been formed on the substrate to include a region to be a channel region, a source region and a drain region; a gate electrode for controlling the conductivity of the region to be a channel region; a gate insulating film arranged between the semiconductor layer and the gate electrode; and a source electrode and a drain electrode, which are connected to the source and drain regions, respectively. At least one of the source and drain regions contains an element to be a donor or an acceptor and a rare-gas element, but the region to be a channel region does not contain the rare-gas element. The atomic weight of the rare-gas element is greater than that of the element to be a donor or an acceptor. The concentration of the rare-gas element in the at least one region as measured in the thickness direction thereof decreases continuously from the upper surface of the at least one region toward its lower surface.

In one preferred embodiment, the concentration profile of the element to be a donor or an acceptor in the thickness direction of the at least one region has a peak within the semiconductor layer.

In this particular preferred embodiment, the concentration of the element to be a donor or an acceptor is higher at the lower surface of the at least one region than at the upper surface thereof.

In another preferred embodiment, the concentration of the element to be a donor or an acceptor in the thickness direction of the at least one region increases continuously from the upper surface of the at least one region toward its lower surface.

The gate electrode may be arranged over the semiconductor layer with the gate insulating film interposed between them. A portion of the gate insulating film, which is located over the at least one region, may contain the rare-gas element. The concentration profile of the rare-gas element in the thickness direction of the gate insulating film and the at least one region may have a peak within the gate insulating film.

Alternatively, the gate electrode may be arranged between the substrate and the semiconductor layer. The device may further include an interlevel dielectric film over the semiconductor layer. A portion of the interlevel dielectric film, which is located over the at least one region, may contain the rare-gas element. The concentration profile of the rare-gas element in the thickness direction of the interlevel dielectric film and the at least one region may have a peak within the interlevel dielectric film.

The rare-gas element may include one or more elements that are selected from the group consisting of Ar, Kr and Xe. The rare-gas element preferably includes Ar.

The element to be a donor or an acceptor may be a donor, which may belong to Group 5b of the periodic table and which may include a dopant element that produces n-type conduction.

Alternatively, the element to be a donor or an acceptor may also be an acceptor, which may belong to Group 3b of the periodic table and which may include a dopant element that produces p-type conduction. The acceptor preferably includes boron.

In another preferred embodiment, the at least one thin-film transistor includes a p-channel thin-film transistor and an n-channel thin-film transistor.

The semiconductor device may further include an additional thin-film transistor on the substrate. Neither the source region nor the drain region of the additional thin-film transistor needs to include the rare-gas element.

In a specific preferred embodiment, the at least one thin-film transistor includes a p-channel thin-film transistor, and the additional thin-film transistor includes an n-channel thin-film transistor.

A semiconductor device fabricating method according to the present invention is a method for fabricating a semiconductor device with a thin-film transistor. The method includes the steps of: (a) providing a substrate on which at least one semiconductor layer, including a crystalline region, has been formed; (b) adding an element to be a donor or an acceptor to at least one of two regions of the semiconductor layer that will be source and drain regions of the thin-film transistor; and (c) adding a rare-gas element, of which the atomic weight is greater than that of the element to be a donor or an acceptor, to the at least one region. The method further includes the step of forming an insulating film that covers the semiconductor layer before the step (c). The step (c) includes adding the rare-gas element to the insulating film and the at least one region from over the insulating film so that the rare-gas element will have a higher concentration at the upper surface of the at least one region than at the lower surface thereof.

In one preferred embodiment, the step (c) includes decreasing the degree of crystallinity of the at least one region. The method further includes the step (d) of subjecting the substrate to a heat treatment, thereby activating the element to be a donor or an acceptor that has been added to the at least one region and re-crystallizing the at least one region, after the steps (b) and (c) have been performed.

In another preferred embodiment, the step (c) includes adding the rare-gas element so that the concentration of the rare-gas element in the at least one region decreases continuously in the thickness direction thereof from the upper surface of the at least one region toward its lower surface.

In still another preferred embodiment, the step (c) includes adding the rare-gas element so that the concentration profile of the rare-gas element in the thickness direction of the insulating film and the at least one region has a peak within the insulating film.

In this particular preferred embodiment, the step (c) includes adding argon to the at least one region at an acceleration voltage of x keV, where the acceleration voltage x and the thickness y (nm) of the insulating film satisfy the inequality $y>1.09x+5.24$.

In yet another preferred embodiment, the steps (b) and (c) are carried out so that a peak depth $Rp1$ of the concentration profile of the rare-gas element becomes shallower than a peak depth $Rp2$ of the concentration profile of the element to be a donor or an acceptor.

The step (b) may include adding the element to be a donor or an acceptor so that the concentration profile of the element to be a donor or an acceptor in the thickness direction of the at least one region has a peak within the semiconductor layer.

The method may further include, after the step of forming an insulating film that covers the semiconductor layer has been performed, the step of forming a gate electrode on the insulating film.

The step (a) may include the steps of: forming a gate electrode on the substrate; depositing a gate insulating film over the gate electrode; and stacking the semiconductor layer on the gate insulating film.

The step (b) may be carried out before the step (c).

Alternatively, the step (c) may be carried out before the step (b).

Still alternatively, the steps (b) and (c) may be carried out simultaneously by performing the same ion doping process.

The same ion doping process may include implanting dopant ions of the element to be a donor or an acceptor and the rare-gas element into the at least one region with the same acceleration energy.

The at least one semiconductor layer may include a first semiconductor layer to be the active layer of a p-channel thin-film transistor and a second semiconductor layer to be the active layer of an n-channel thin-film transistor. The step (b) may include the steps of: adding an element to be an acceptor to at least one of two regions of the first semiconductor layer that will be source and drain regions; and adding an element to be a donor to at least one of two regions of the second semiconductor layer that will be source and drain regions. The step (c) may include adding the rare-gas element to the at least one region of the first semiconductor layer and the at least one of the second semiconductor layer at the same time.

An electronic device according to the present invention includes a semiconductor device according to any of the preferred embodiments of the present invention described above.

The electronic device may include a display section with the semiconductor device.

Effects of the Invention

According to the present invention, the degree of crystallinity of the source/drain regions and the region to be a channel region can be increased and the element to be a donor or an acceptor that has been added to the source/drain regions can be activated more efficiently as well. As a result, the resistance in the source/drain regions can be reduced, and therefore, a thin-film transistor that has higher performance, and can operate at higher speeds, than conventional ones is provided.

In addition, according to the present invention, such a high-performance semiconductor device with a thin-film transistor can be fabricated without complicating the manufacturing process overly or increasing the manufacturing cost significantly.

According to the semiconductor device manufacturing process of the present invention, by introducing a rare-gas element to regions of a semiconductor film to be source/drain regions, the degree of crystal destruction caused on those regions can be controlled. That is why through the heat treatment process to be performed after that (i.e., an activating annealing process), the element to be a donor or an acceptor that has been added to those regions to be source/drain regions can be activated efficiently. On top of that, as the degree of crystal destruction caused by the rare-gas element on those regions to be source/drain regions decreases from the upper surface toward the lower surface, re-crystallization can get done efficiently through the heat treatment process from the lower region where a small degree of crystal destruction has been caused toward the upper region where a great degree of crystal destruction has been caused. As a result, the source/drain regions can have their carrier density and carrier mobility both increased, and therefore, can have lower resistance in them than in any conventional device.

BRIEF DESCRIPTION OF DRAWINGS

FIGS. 3(A) and 3(B) are schematic representations illustrating a thin-film transistor as a preferred embodiment of the present invention, wherein FIG. 3(A) is a schematic cross-sectional view illustrating the thin-film transistor, and FIG. 3(B) illustrates the concentration profile of a rare-gas element in the thickness direction of the source/drain regions of the thin-film transistor.

Figure 1:
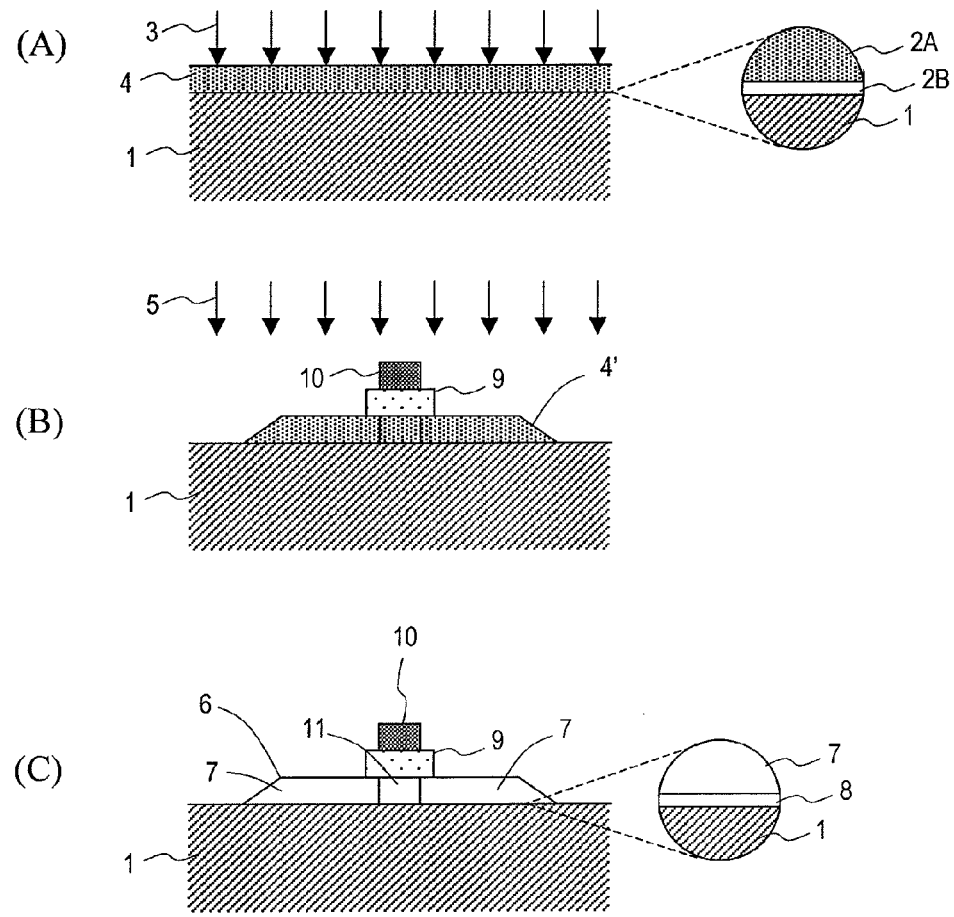
FIGS. 1(A) to 1(C) are cross-sectional views illustrating conventional process steps to define source/drain regions.

DESCRIPTION OF REFERENCE NUMERALS 105, 120 crystalline semiconductor layer
101 substrate
106 gate insulating film
107 gate electrode
108 dopant element (boron)
109, 112 regions (to be source/drain regions)
110 region to be channel region
111 rare-gas element (argon)
113 source/drain regions
114 interlevel dielectric film
115 electrodes and interconnects of thin-film transistor
116 thin-film transistor
122 concentration profile of rare-gas element

BEST MODE FOR CARRYING OUT THE INVENTION

Hereinafter, a preferred embodiment of a semiconductor device according to the present invention will be described with reference to the accompanying drawings.

A semiconductor device according to any of various preferred embodiments of the present invention includes at least one thin-film transistor. FIG. 3(A) is a schematic cross-sectional view illustrating a thin-film transistor as a specific preferred embodiment of the present invention, and FIG. 3(B) illustrates the concentration profile of a rare-gas element that has been added to the source/drain regions of the thin-film transistor. It should be noted that the semiconductor device of the present invention has only to include at least one thin-film transistor and could be used broadly on an active-matrix substrate and in any type of electronic device including a liquid crystal display device and an organic EL display device.

The thin-film transistor 116 of this preferred embodiment includes a substrate 101, an island 120 of crystalline semiconductor layer 120 that has been formed on the substrate 101, a gate insulating film 106 that has been deposited over the semiconductor layer 120, and a gate electrode 107 arranged on the gate insulating film 106. The gate electrode 107 and the semiconductor layer 120 are covered with an interlevel dielectric film 114. The crystalline semiconductor layer 120 includes a region 110 to be a channel region (which will be referred to herein as a "channel-to-be region")) and source/drain regions 113 that are arranged so as to interpose the channel-to-be region 110. The gate electrode 107 is arranged so as to mask the channel-to-be region 110. And source/drain electrodes 115 are arranged on the interlevel dielectric film 114 and electrically connected to the source/drain regions 113, respectively, through contact holes that have been cut through the interlevel dielectric film 114.

At least one of the source/drain regions 113 includes an element to be a donor or an acceptor (which will be referred to herein as a "dopant element") and a rare-gas element (such as Ar) that has a greater atomic weight than the dopant element. In this preferred embodiment, not only the source/drain regions 113 but also portions of the gate insulating film 106 that are located over the source/drain regions 113 include the rare-gas element. And as shown in FIG. 3(B), the concentration profile 122 of the rare-gas element in the thickness direction of the gate insulating film 106 and the source/drain regions 113 has a peak P within the gate insulating film 106. That is why the concentration of the rare-gas element included in the source/drain regions 113 decreases continuously from their upper surface toward their lower surface.

Furthermore, in this preferred embodiment, the channel-to-be region 110 and a portion of the gate insulating film 106 that is located right over the channel-to-be region 110 do not include the rare-gas element.

The source/drain regions 113 of the thin-film transistor 116 shown in FIG. 3(A) may be defined in the following manner, for example. FIGS. 4(A) through 4(D) are schematic cross-sectional views illustrating respective process steps to define the source/drain regions 113.

First of all, as shown in FIG. 4(A), an island 105 of a crystalline semiconductor layer is formed on a substrate 101, and then a gate insulating film 106 and a gate electrode 107 are formed in this order on the crystalline semiconductor layer 105. The gate electrode 107 is arranged so as to mask the channel-to-be region of the crystalline semiconductor layer 105.

Next, as shown in FIG. 4(B), ions of a dopant element 108 (which may be boron, for example) are implanted into the crystalline semiconductor layer 105 using the gate electrode 107 as a mask. The ions of the dopant element 108 pass through the gate insulating film 106 to get implanted into the crystalline semiconductor layer 105 and define dopant ion implanted regions 109 there. The rest of the crystalline semiconductor layer 105, to which the dopant element has not been added, will be a channel-to-be region.

Thereafter, as shown in FIG. 4(C), to decrease the degree of crystallinity of the crystalline semiconductor layer 105, ions of at least one rare-gas element 111 (which may be Ar, for example), which has a greater atomic weight than the dopant element 108, are implanted by using the gate electrode 107 as a mask again. The ions of the rare-gas element 111 pass through the gate insulating film 106 and get implanted into the dopant ion implanted region 109, thereby defining crystal destroyed regions 112 there.

In this case, if the conditions of the ion implantation process to add the rare-gas element are determined so that the concentration profile of the rare-gas element in the depth direction has a peak P within the gate insulating film 106, then the rare-gas element added will have a concentration profile that will decrease continuously from the upper surface of the dopant ion implanted regions 109 toward the lower surface thereof. By adopting such a technique, the crystallinity can be decreased mainly in the upper portion with the crystal destruction in the lower portion minimized. As a result, the closer to the upper surface, the more significantly the degree of crystallinity of those regions 112 will decrease. Since such regions 112 can recover their crystallinity easily through an activating annealing process later, the process margin can be expanded.

It should be noted that if ions of a rare-gas element were implanted into a semiconductor film that has an exposed surface (which is called a "bare doping process") as in Patent Document No. 1 cited above, then the peak of the concentration profile of the rare-gas element added would be located under the upper surface of the semiconductor film. Thus, such a concentration profile that decreases continuously from the upper surface toward the lower surface could not be obtained in that case.

On the other hand, according to this preferred embodiment, ions of the rare-gas element 111 are implanted through the gate insulating film 106 into the semiconductor layer 105. That is why by adjusting the implantation conditions appropriately, such a concentration profile that has a peak inside the gate insulating film 106 over the semiconductor layer 105 and that decreases continuously from the upper surface of the semiconductor layer 105 toward the lower surface thereof can be obtained. Optionally, ions of the rare-gas element 111 could also be implanted through any other film, not the gate insulating film 106. Also, portions of the regions 112 near the lower surface thereof preferably stay polycrystalline because the regions 112 can be re-crystallized smoothly later through the activating annealing process by using crystal grains, remaining in the polycrystalline portion, as seed crystals in that case.

Thereafter, as shown in FIG. 4(D), the activating annealing process is carried out, thereby activating the dopant element 108 that has been added to the regions 112 and re-crystallizing the regions 112. As a result, the source/drain regions 113 are defined.

Figure 2:
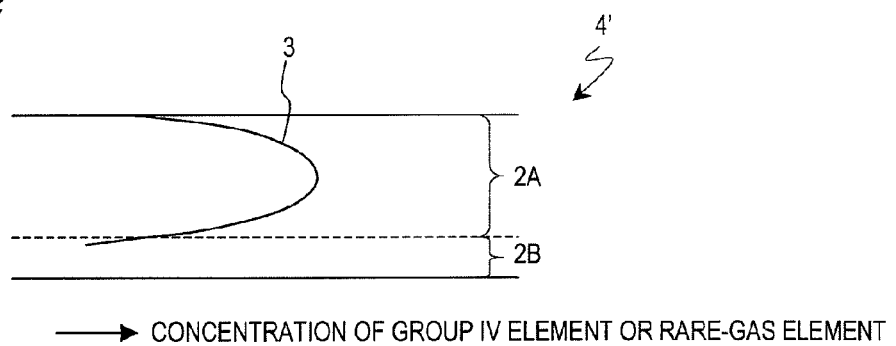
FIG. 2 illustrates the concentration profile of a Group IV element or a rare-gas element that has been introduced into islands of semiconductor layer by a conventional technique.

Through this activating annealing process, the regions 112 get re-crystallized. In this case, if the crystallinity of those regions 112 has been decreased sufficiently by the addition of the rare-gas element 111, then the dopant atoms can be introduced easily into the interstitial sites of the constituent element Si of the semiconductor during the re-crystallization process. As a result, the dopant element can be activated more efficiently at a higher rate. In addition, since those regions 112 have the rare-gas element 111 with such a concentration profile, the degree of the crystal destruction caused on the regions 112 decreases from their upper surface toward their lower surface. That is why the crystallinity can be recovered efficiently through the activating annealing process from the lower portion of the regions 112 toward their upper portion. On top of that, compared to a conventional process in which the rare-gas element is added using the concentration profile shown in FIG. 2, the overall degree of crystal destruction caused on the regions 112 can be less significant, and therefore, their crystallinity can be recovered sufficiently by re-crystallization. As a result, the source/drain regions 113 with good crystallinity can be obtained.

According to this preferred embodiment, not just can the carrier density be increased by activating the dopant element, added to the source/drain regions 113, more efficiently but also can the crystallinity of the source/drain regions 113 be increased as well. Thus, the carriers can have increased mobility in those regions. Consequently, the resistance in the source/drain regions 113 can be reduced more significantly than in a conventional device.

In addition, according to this preferred embodiment, the rare-gas element 111 is not added to the channel-to-be region 110, and therefore, the degree of crystallinity is never decreased in the channel-to-be region 110 by the addition of the rare-gas element 111 and no residual defects will be caused there unlike the conventional process shown in FIG. 1. As a result, the deterioration in TFT performance, which would otherwise be caused due to a decrease in the crystallinity of the channel-to-be region 110 and presence of residual defects, can be minimized.

In this preferred embodiment, to reduce the resistance in the source/drain regions 113 effectively, it is important to determine to what degree of crystal destruction should be caused on the semiconductor layer 105 (i.e., the regions 112) by the introduction of the dopant element 108 or the rare-gas element 111. The present inventors discovered that the crystallinity recovery caused by activating annealing process and the carrier activation do not advance independently of each other but are deeply correlated with each other. That is to say, to activate carriers, the crystals need to be destroyed to a certain degree. This is because the regions 112, of which the crystals have been destroyed by being implanted with ions of the dopant element 108 and the rare-gas element 111, will catch the dopant atoms between the Si interstitial sites while being re-crystallized by the activating annealing process, thereby activating the dopant element efficiently. That is why if just a minor degree of crystal destruction were caused, then the carriers would be activated less efficiently. However, if the crystallinity of the regions 112 were decreased too much, then it would be difficult to recover the crystallinity even by activating annealing process and the resistance in the source/drain regions 113 would rather increase. Thus, according to this preferred embodiment, the degree of crystal destruction caused on the regions 112 by the introduction of the dopant element 108 and the rare-gas element 111 is controlled by appropriately adjusting the atomic weights of the dopant element 108 and the rare-gas element 111 and the implant dose, acceleration voltage and other implantation process conditions.

As described above, the method of the present invention uses the rare-gas element 111 for the purpose of controlling the degree of crystal destruction caused on the regions 112 of the semiconductor layer 105 that will be source/drain regions eventually. As a result, the degree crystal destruction caused on the regions 112 can be controlled independently of the crystal destruction caused by the introduction of the dopant element 108, thus causing the best degree of crystal destruction that would contribute to activating carriers most efficiently and yet would allow the crystals to recover their crystallinity easily. If a species of element that has a greater atomic weight than the dopant element 108 is used as the rare-gas element 111, the crystal destruction can be caused and its degree can be controlled more easily. However, if too much crystal destruction were caused by the rare-gas element 111 on the regions 112 to be source/drain regions, then it would be difficult to recover the crystallinity even by the heat treatment (activating annealing) process later. That is why at least some portions to be nuclei of crystals for re-crystallization should be left around the lower surface of the regions 112. And to leave such portions, the rare-gas element 111 needs to be introduced so that the concentration of the rare-gas element 111 becomes higher at the upper surface of the regions 112 than at their lower surface. As a result, the degree of crystal destruction caused can be controlled to be greater at the upper surface of the regions 112 than at their lower surface.

As described above, the degree of crystal destruction caused on the regions 112 is determined by not only the conditions for implanting ions of the rare-gas element but also the ones for implanting ions of the element 108 to be a donor or an acceptor. Therefore, the degree of crystal destruction caused can be controlled in the depth direction of the regions 112 by adjusting (the parameters of) these two ion implantation processes.

Hereinafter, the concentration profile in the thickness direction of the dopant element 108 that has been added to at least one of the source/drain regions 113 according to this preferred embodiment will be described with reference to the accompanying drawings.

Figure 5:
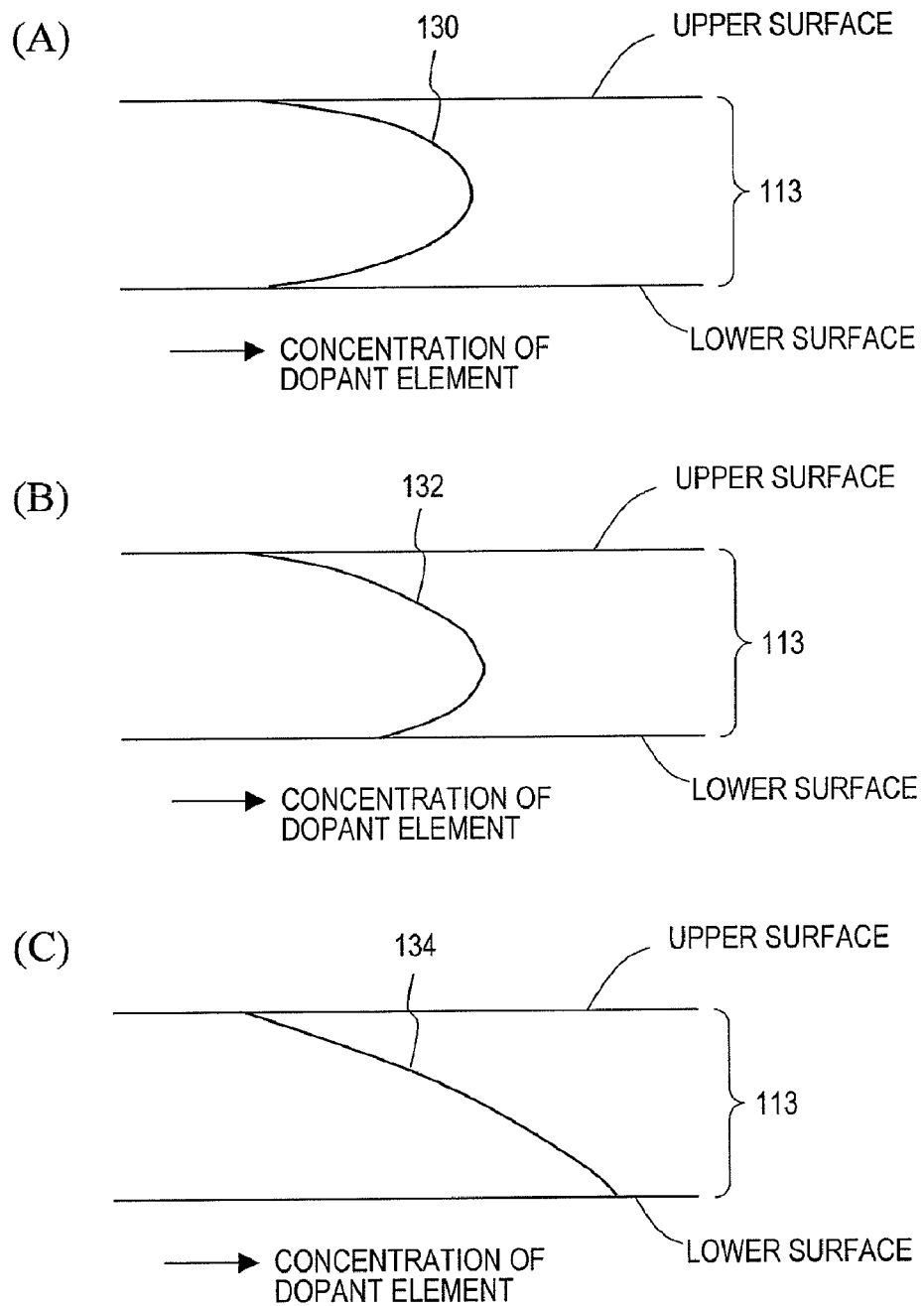
FIGS. 5(A) through 5(C) illustrate exemplary concentration profiles of a dopant element in the source/drain regions of a thin-film transistor as a preferred embodiment of the present invention.
Figure 6:
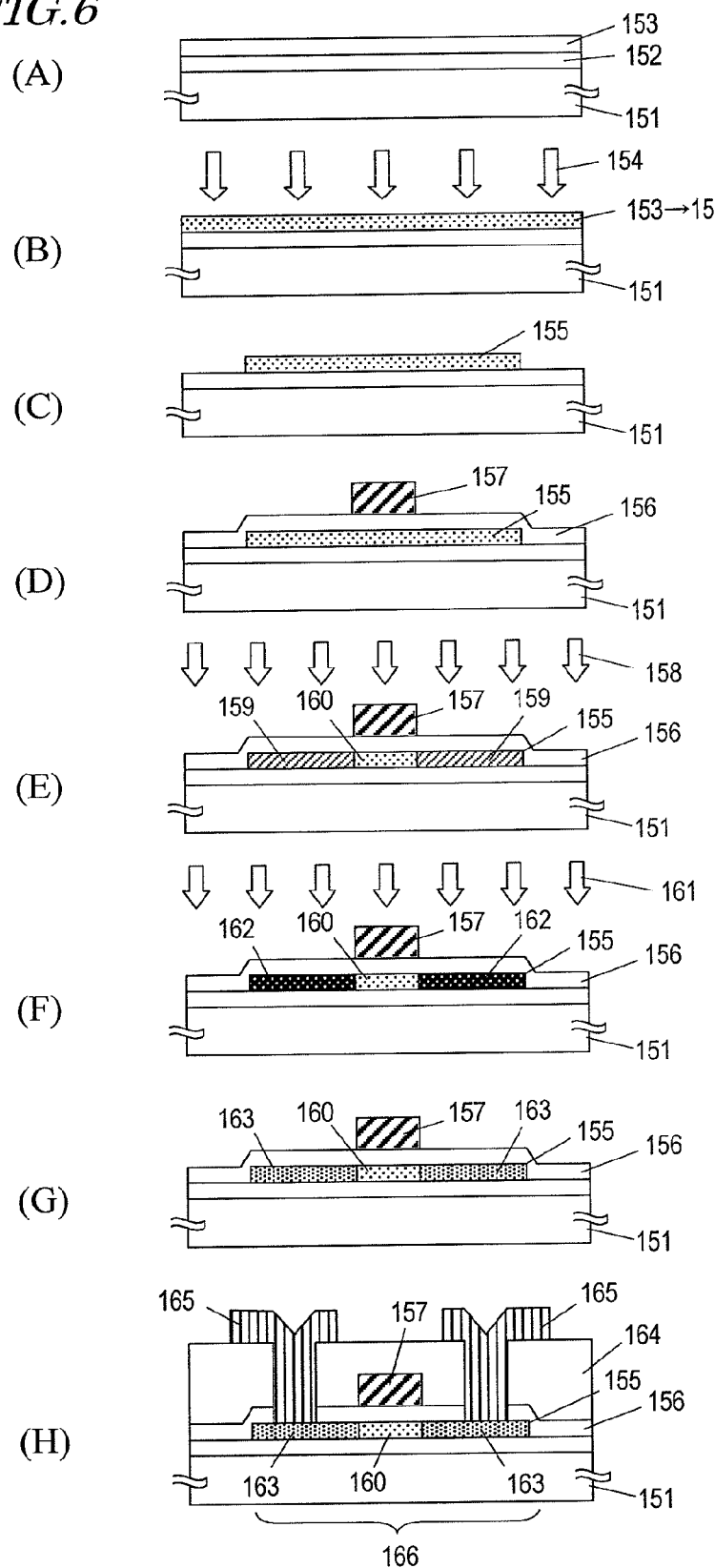
FIGS. 6(A) through 6(H) are schematic cross-sectional views illustrating respective process steps to fabricate a thin-film transistor according to a first preferred embodiment of the present invention.

According to this preferred embodiment, the concentration profile of the dopant element 108 in the thickness direction of at least one of the source/drain regions 113 preferably has a peak inside the semiconductor layer 120 (i.e., inside the source/drain region(s) 113) as indicated by the curves 130 and 132 in FIGS. 5(A) and 5(B). In that case, the dopant element 108 can have an increased concentration in the source/drain region(s) 113, and therefore, the doping efficiency can be increased there.

Meanwhile, the concentration of the element 108 to be a donor or an acceptor in at least one of the source/drain regions 113 in the thickness direction thereof may be higher at the lower surface of the source/drain region(s) 113 than at its/their upper surface. If the peak of the concentration of the dopant element 108 is located in the lower portion of the source/drain region(s) 113 as indicated by the curve 132 in FIG. 5(B), for example, the element 108 to be a donor or an acceptor can have an increased concentration in the source/drain region(s) 113. In addition, compared to a situation where the concentration profile has a peak around the middle of the thickness of the source/drain region(s) 113, a greater degree of crystal destruction can be caused by the addition of the dopant element, and therefore, the eventual degree of crystal destruction caused by the introduction of the rare-gas element can be controlled within a broader range.

Optionally, the concentration of the element 108 to be a donor or an acceptor may increase continuously from the upper surface of the source/drain regions 113 toward their lower surface as indicated by the curve 134 in FIG. 5(C). In that case, the peak of the concentration of the dopant element 108 will be located under the source/drain regions 113, not inside the regions 113, and therefore, the doping efficiently would decrease. Nevertheless, an even greater degree of crystal destruction can be caused by the addition of the dopant element 108 than in FIG. 5(A) or 5(B), and therefore, the eventual degree of crystal destruction caused by the introduction of the rare-gas element 111 can be controlled within a broader range.

The rare-gas element 111 for use in this preferred embodiment is preferably one or more elements selected from the group consisting of Ar, Kr and Xe. By using at least one of these elements, significant crystal destruction can be caused on the regions 112 to be source/drain regions, and therefore, the dopant element 108 that has been added to the regions 112 can be activated much more effectively and more efficiently by using their re-crystallization process. More preferably, the rare-gas element 111 includes argon. This is because argon is the least expensive and most cost-effective of the three, would allow the designer to control the concentration profile more easily by adjusting the doping process conditions, and would achieve substantially the same effect by causing crystal destruction as another heavier element than argon.

The dopant element 108 is not limited to any particular element. But in making an n-channel TFT, the element to be a donor preferably includes a dopant element that belongs to Group 5b of the periodic table and that will produce n-type conduction. On the other hand, in making a p-channel TFT, an element to be an acceptor preferably includes a dopant element that belongs to Group 3b of the periodic table and that will produce p-type conduction. If boron is used as the dopant element (i.e., an element to be an acceptor) 108, that element is controllable most easily, and is least expensive, as an acceptor during its implantation process. Since boron has a light atomic weight, they believe that it should be very difficult to cause significant crystal destruction on a semiconductor layer by introducing that element alone and that it has been regarded as one of the most difficult elements to activate. According to the present invention, however, boron can be activated much more efficiently, and therefore, it is a good move to use boron. On top of that, if boron is used as the dopant element 108, almost no crystal destruction will be caused by the introduction of boron itself, and therefore, the degree of crystal destruction caused on the semiconductor layer can be controlled substantially only by the addition of a rare-gas element. As a result, the degree of crystal destruction caused can be optimized easily.

The thin-film transistor 116 shown in FIG. 3 has a top gate structure. According to this preferred embodiment, however, the thin-film transistor may also have a bottom gate structure in which a gate electrode is arranged on the substrate and under a semiconductor layer. In that case, after an interlevel dielectric film has been deposited over a semiconductor layer, ions of a rare-gas element may be implanted into regions of the semiconductor layer to be source/drain regions from over the interlevel dielectric film. Then, the concentration of the rare-gas element in the source/drain regions can be decreased continuously from the upper surface of the regions toward their lower surface. Still alternatively, the thin-film transistor 116 may include LDD (lightly doped drain) regions. In that case, however, it is preferred that the rare-gas element not be added to portions of the semiconductor layer to be a channel region and the LDD regions.

Optionally, the semiconductor device of this preferred embodiment may be a CMOS circuit in which an n-channel TFT and a p-channel TFT area arranged to have a complementary structure. In that case, at least one of the n-channel and p-channel TFTs may have the source/drain regions that have been defined by the method that has already been described with reference to FIG. 4. Specifically, if at least one of the source/drain regions of the p-channel TFT includes a rare-gas element in a predetermined concentration profile, the source/drain regions of the n-channel TFT do not have to include any rare-gas element. Conversely, if at least one of the source/drain regions of the n-channel TFT includes a rare-gas element in a predetermined concentration profile, the source/drain regions of the p-channel TFT do not have to include any rare-gas element. Thus, by applying the present invention to a TFT circuit with such a CMOS configuration, the resistance in the source/drain regions of the n-channel and p-channel TFTs can be controlled independently of each other. As a result, their resistance can be optimized with or without an additional process step carried out according to the TFT performance required.

However, if ions of a rare-gas element need to be implanted into the source/drain regions of both n-channel and p-channel TFTs, one element may be added to the source/drain regions of the n-channel TFT and another element may be added to those of the p-channel TFT using a photoresist mask, for example, when ion of those dopant elements are implanted. And when ions of the rare-gas element are implanted, the rare-gas element may be added to the respective source/drain regions of both the n-channel and p-channel TFTs at the same time without masking any of those source/drain regions. In that case, the ions of the rare-gas element can be implanted more efficiently, thus increasing the productivity.

But it is preferred that the rare-gas element not be added to the source/drain regions of the n-channel TFT of a CMOS circuit but be added only to the source/drain regions of the p-channel TFT thereof. The reason is that if phosphorus were added as a dopant element to the source/drain regions of the n-channel TFT, phosphorus, which has a heavy atomic weight and which could cause significant crystal destruction, might decrease the crystallinity of the source/drain regions a lot. In that case, if the rare-gas element were further added to the source/drain regions to which phosphorus has already been introduced, then the degree of crystal destruction caused could be too much according to the implantation conditions to recover the crystallinity sufficiently even by the heat treatment later.

Figure 4:
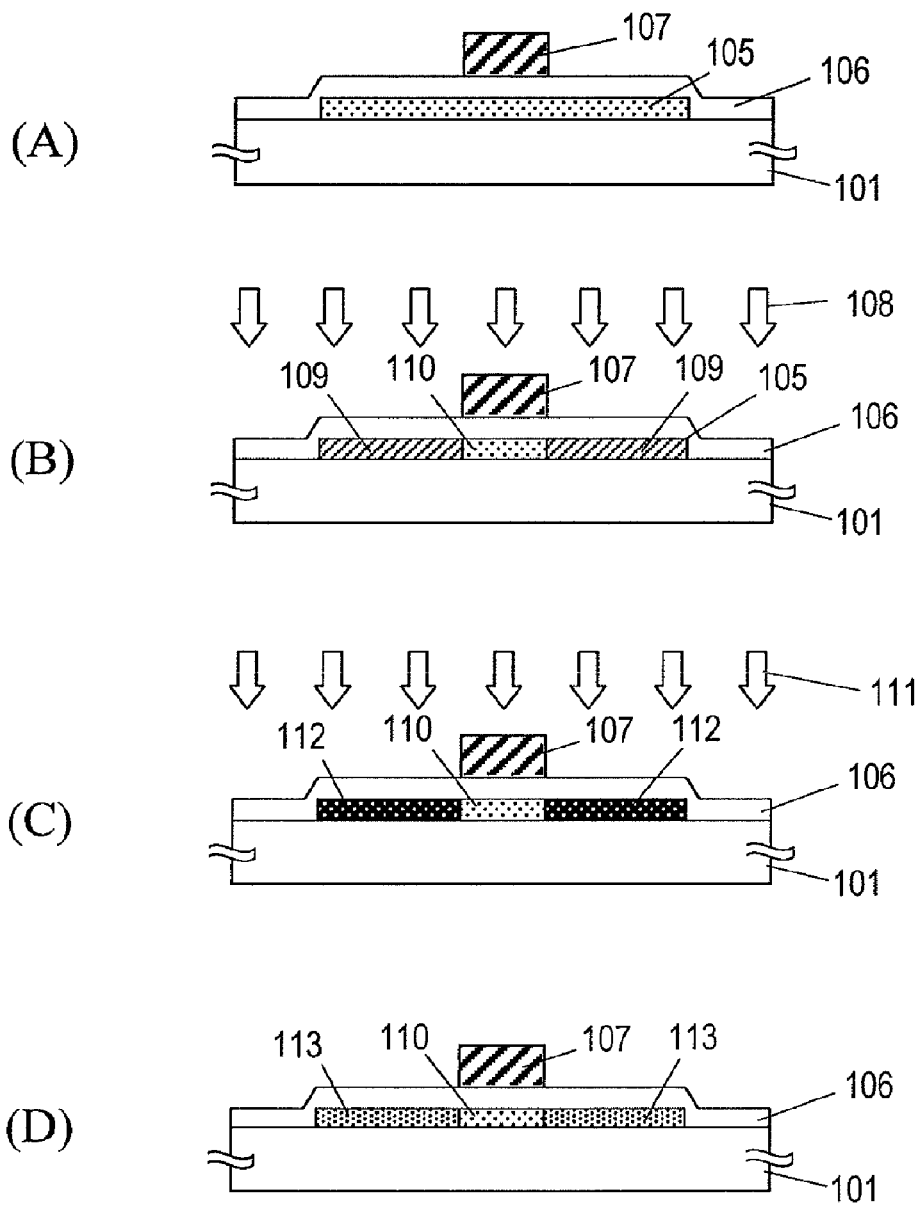
FIGS. 4(A) through 4(D) are cross-sectional views illustrating respective process steps to define source/drain regions in a thin-film transistor as a preferred embodiment of the present invention.

According to this preferred embodiment, the source/drain regions of the TFT do not always have to be defined by the method that has already been described with reference to FIG. 4. According to the method shown in FIG. 4, it is after ions of the dopant element 108 have been implanted that ions of the rare-gas element 111 are implanted. However, ions of the rare-gas element 111 may also be implanted before ions of the dopant element 108 are implanted. That is to say, the effect of the present invention can be achieved, no matter whether ions of the dopant element 108 or those of the rare-gas element 111 are implanted first. But if ions of the dopant element 108 are implanted earlier, then incomplete bonding states, which are produced when the ions of the dopant element 108 get implanted, can be once broken and reset by implanting ions of the rare-gas element 111. Thus, compared to a situation where ions of the rare-gas element 111 are implanted earlier, the activation can be done more efficiently while the crystallinity is being recovered. Furthermore, if ions are selectively implanted into only portions of a semiconductor layer to be active regions for a number of TFTs being fabricated on the same semiconductor substrate, the following advantages can also be achieved.

The ion implantation process described above is normally carried out by masking a part of a semiconductor layer, into which no ions need to be implanted, with a photoresist so that ions are selectively implanted into only the rest of the semiconductor layer that is not masked with the photoresist. However, if there were some foreign matter such as particles in the ion implantation system, those particles could also be electrified with ions, be accelerated, and collide against the substrate according to such a technique. Those accelerated particles might chip the photoresist that masks the region of the semiconductor layer into which no ions need to be implanted. If ions of the rare-gas element 111 were implanted earlier in such a situation, ions of the rare-gas element 111 would chip the photoresist and then ions of the dopant element 108 would get implanted unintentionally into a region of the semiconductor layer that should be masked with the photoresist, thus deteriorating the electrical characteristic of the TFT. On the other hand, in a situation where ions of the dopant element 108 are implanted earlier, even if the ion implantation of that dopant element 108 chipped the photoresist to let ions of the rare-gas element 111 be implanted into a region of the semiconductor layer that should be masked with the photoresist, the rare-gas element 111 added would not harm the electrical characteristic and would not cause defects directly. For that reason, it is more advantageous to implant ions of the dopant element 108 earlier than those of the rare-gas element 111.

If necessary, both the dopant element 108 and the rare-gas element 111 may be added to the regions to be source/drain regions at the same time by the same ion implantation process. Then, the effect of the present invention can be achieved by performing the same number of process steps as the conventional manufacturing process without adding the process step of implanting ions of a rare-gas element. That is why this method is very cost effective. In that case, ions of the dopant element 108 and rare-gas element 111 are preferably implanted into regions to be source/drain regions with the same acceleration energy. For example, when the source/drain regions of a p-channel TFT are defined, an acceptor element and a rare-gas element are mixed together as material gases and then added to the regions to be source/drain regions at the same time. According to this method, there is no need to increase the number of manufacturing process steps, the tact time is almost as long as the conventional one, and therefore, the effect of the present invention can be achieved with high productivity maintained. Nevertheless, the acceleration voltage during the doping process should be appropriately adjusted according to the kinds of the dopant element material gases and the kind of the rare-gas element used.

Hereinafter, preferred embodiments of a semiconductor device according to the present invention will be described more specifically with reference to the accompanying drawings.

Embodiment 1

FIGS. 6(A) through 6(H) are schematic cross-sectional views illustrating respective manufacturing process steps to fabricate a thin-film transistor as a first specific preferred embodiment of the present invention. In the Following description of the first preferred embodiment, it will be described how to fabricate a p-channel TFT with a top gate structure on a glass substrate. The TFT of this preferred embodiment can be used not only as a pixel switching element or a driver circuit component for an active-matrix-addressed LCD or an organic EL display device but also as a component of a thin-film integrated circuit.

First of all, as shown in FIG. 6(A), an undercoat film 152 of silicon dioxide is deposited by plasma CVD process, for example, to a thickness of approximately 100-500 nm on a glass substrate 151, and then an intrinsic (i-type) amorphous silicon (a-Si) film 153 is deposited to a thickness of approximately 20-80 nm (e.g., 50 nm) thereon.

The undercoat film 152 is provided to prevent impurities from diffusing from the glass substrate 151. The undercoat film 152 does not have to be made of silicon dioxide but may also be made of silicon nitride or any other suitable material. Alternatively, the undercoat film 152 may be a stack of a silicon dioxide film and a silicon nitride film. The structure and thickness of the amorphous silicon film 153 and the method and conditions for forming it are not particularly limited but may be determined appropriately.

Next, as shown in FIG. 6(B), the amorphous silicon film 153 is irradiated with a laser beam 154 to get crystallized and form a crystalline silicon film 153a. The laser beam 154 may be an XeCl excimer laser beam (with a wavelength of 308 nm and a pulse width of 40 nsec) or a KrF excimer laser beam (with a wavelength of 248 nm). The laser beam 154 has been shaped so as to leave an elongated beam spot on the surface of the substrate 151. By sequentially scanning the surface of the substrate with the laser beam perpendicularly to the direction in which the beam spot is elongated, the entire surface of the substrate can get crystallized. In this process step, if the substrate gets scanned so that the beam spots partially overlap with each other, an arbitrary point of the amorphous silicon film 153 is irradiated with the laser beam a number of times. As a result, the degree of uniformity can be increased. The energy of the laser beam 154 needs to be determined to fall within an appropriate range because too low energy would result in an insufficient degree of crystallization but too high energy would further amorphize the amorphous silicon film.

Thereafter, as shown in FIG. 6(C), excessive parts of the crystalline silicon film 153a are removed to get electrical isolation done between respective devices, thereby forming islands 155 of semiconductor layer, each of which will be the active regions (i.e., source/drain regions and a channel region) of a TFT.

Subsequently, as shown in FIG. 6(D), a gate insulating film 156 is deposited over the island 155 of semiconductor layer, and then a gate electrode 157 is formed on the gate insulating film 156.

In this preferred embodiment, a silicon dioxide film is deposited to a thickness of 20-150 nm (e.g., 80 nm) as the gate insulating film 156. The silicon dioxide film may be formed by decomposing and depositing TEOS (tetra ethoxy ortho silicate) as a source gas along with oxygen by RF plasma CVD process. Then, the substrate is preferably heated to a temperature of 150-600° C., more preferably 300-450° C. Alternatively, the silicon dioxide film may also be formed by performing either a low-pressure CVD process or an ordinary pressure CVD process using TEOS as a source gas along with ozone gas. In that case, the substrate is preferably heated to a temperature of 350-600 AD, more preferably a temperature of 400-550° C. Optionally, in order to improve the bulk properties of the gate insulating film 156 and the interfacial property between the crystalline silicon film and the gate insulating film 156, an annealing process may be carried out at a temperature of 500-600° C. for one to four hours within an inert gas atmosphere after the gate insulating film 156 has been formed.

The gate electrode 157 can be obtained by depositing a metal film by sputtering process, for example, and then patterning the metal film. Considering its thermal resistance that the metal film will have to exhibit later during a heat treatment process for the purpose of activation, the metal film is preferably made of a refractory metal such as tantalum (Ta), tungsten (W), molybdenum (Mo), or titanium (Ti) or an alloy thereof. In this preferred embodiment, tungsten (W) is deposited to a thickness of 300-600 nm (e.g., 400 nm).

Next, as shown in FIG. 6(E), ions of boron 158 are implanted as a p-type dopant into the island 100 of semiconductor layer by ion doping process using the gate electrode 157 as a mask. The ions of boron 158 pass through the gate insulating film 156 with a thickness of 80 nm to get implanted into regions of the semiconductor layer 155 that are not masked with the gate electrode 157. As a result of this process step, boron ions 158 get implanted into the regions of the island 155 of semiconductor layer that are not masked with the gate electrode 157, thereby defining dopant ion implanted regions 159 there. On the other hand, the other region that has been masked with the gate electrode 157 and has not been implanted with the boron ions 158 will be a channel region 160 of a TFT.

In this preferred embodiment, this process step of implanting boron ions 158 is carried out using diborane ($B_2H_6$) as a doping gas at an acceleration voltage of 40-90 kV (e.g., 60 kV) and at an implant dose of $1\times10^{15}$ to $8\times10^{15}$ cm$^{-2}$ (e.g., $2\times10^{15}$ cm$^{-2}$).

Subsequently, as shown in FIG. 6(F), argon ions 161 are implanted into the dopant ion implanted regions 159 by ion doping process using the gate electrode 157 as a mask, thereby defining crystal destroyed regions 162. In this process step, the argon ions 161 are not implanted into the channel region 160 under the gate electrode 157, either, and therefore, the crystallinity of the channel region 160 stays intact.

In this preferred embodiment, argon is used as a doping gas, an acceleration voltage of 20-70 kV (e.g., 50 kV) is applied, and the implant dose is determined within the range of $1\times10^{14}$ to $8\times10^{15}$ cm$^{-2}$ (e.g., $1\times10^{15}$ cm$^{-2}$).

In this process step, the acceleration voltage of the argon ions 161 is determined by the thickness of the gate insulating film 156, which the argon ions 161 should pass during the doping process, so that the peak depth Rp of the argon ions 161 will be located within the gate insulating film 156. Hereinafter, the relation between the acceleration voltage and the thickness of the gate insulating film 156 will be described specifically with reference to FIG. 15, in which the abscissa x represents the acceleration voltage (keV) at which the argon ions 161 are implanted and the ordinate y represents the thickness (nm) of the gate insulating film 156 on the semiconductor layer. The acceleration voltage x and the thickness y of the gate insulating film 156 preferably fall within the range A in which the inequality y>1.09x+5.24 is satisfied. The linear function Rp=1.09x+5.24 shown in FIG. 15 indicates what the relation between the acceleration voltage x (keV) of the argon ions and the peak depth Rp (nm) should be when the argon ions are implanted into the insulating film. By determining the acceleration voltage x so that the thickness y of the gate insulating film 56 is greater than the peak depth Rp (i.e., so that y>Rp is satisfied), the peak depth Rp can be located inside the gate insulating film 156.

Figure 7:
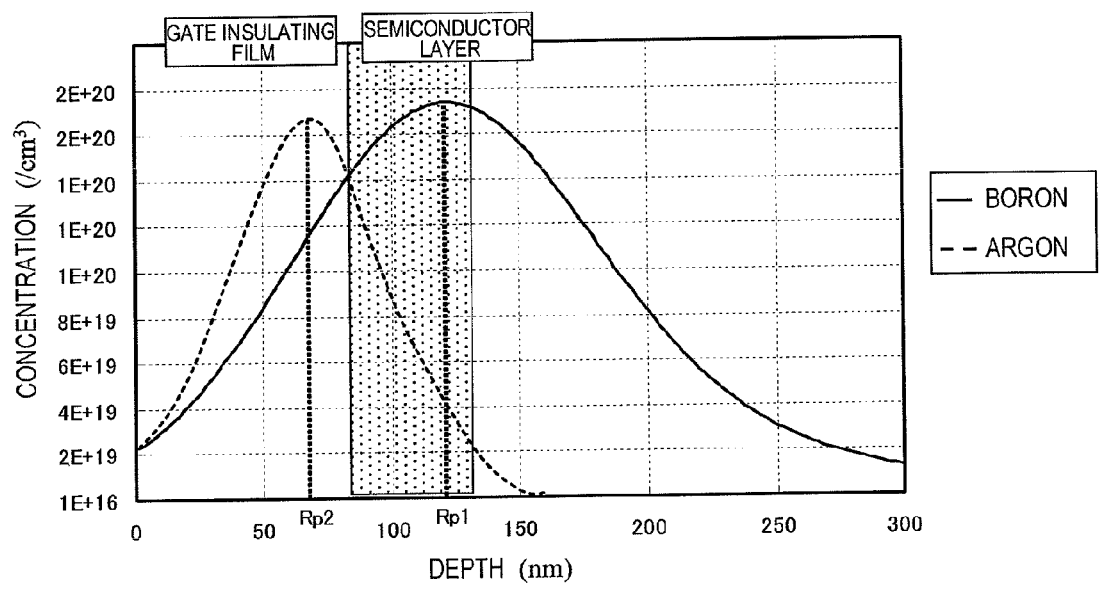
FIG. 7 illustrates the concentration profiles of boron and argon atoms that have been introduced into the source/drain regions of the thin-film transistor as the first preferred embodiment of the present invention.

The concentration profiles that the boron atoms 158 and the argon atoms 161 have in the depth direction of the semiconductor layer 155 in this process step are shown in FIG. 7. As can be seen from FIG. 7, the peak depth Rp1 of the boron atoms 158 is located at a depth of approximately 120 nm under the surface of the gate insulating film 156, which corresponds to a depth of approximately 40 nm under the surface of the island 155 of semiconductor layer 155. On the other hand, the peak depth Rp2 of the argon atoms 161 is located inside the gate insulating film 156 on the semiconductor layer 155 and at a depth of approximately 60 nm under the surface of the gate insulating film 156. In this case, the concentration profile of the argon atoms 161 in the semiconductor layer 155 decreases continuously from the upper surface of the semiconductor layer 155 toward the lower surface thereof.

In this preferred embodiment, the process step of implanting the boron ions 158 is carried out earlier than the process step of implanting the argon ions 161. However, the process step of implanting the argon ions 161 may be performed earlier than the process step of implanting the boron ions 158. Also, in the preferred embodiment described above, ions of argon (Ar) 161 are implanted as a rare-gas element into the semiconductor layer 155 to destroy its crystals. Alternatively, krypton (Kr) or xenon (Xe) may be used instead.

Next, a heat treatment process (i.e., an activating annealing process) is carried out within an inert atmosphere (such as a nitrogen atmosphere). As a result of this heat treatment process, the regions 162 of the semiconductor layer 155 that have been implanted with boron ions 158 and argon ions 161 get re-crystallized. During the re-crystallization process, the boron atoms 158 are caught in interstitial sites of silicon and are activated efficiently. Consequently, these regions 162 can have their resistance reduced to be source/drain regions 163 as shown in FIG. 6(G).

The source/drain regions 163 that have been obtained by such a process have a sheet resistance of approximately 0.5 to 0.8 k$\Omega$/□. When the conventional process was performed just as described above except that argon ions were not added, the source/drain regions had a sheet resistance of approximately 1.5 to 2.0 k$\Omega$/□. Thus, it can be seen that according to this preferred embodiment, the resistance can be reduced to approximately one third to one half compared to the conventional process. This heat treatment process may be carried out using a normal heat treatment furnace but is preferably performed as an RTA process. Among other things, an RTA system designed to increase and decrease the temperature of the substrate instantaneously by spraying a high-temperature inert gas toward the surface of the substrate is particularly preferred.

Thereafter, as shown in FIG. 6(H), either a silicon dioxide film or a silicon nitride film is deposited to a thickness of approximately 600 nm as an interlevel dielectric film 164. If a silicon dioxide film needs to be deposited, TEOS is preferably used as a source material and may be subjected to a plasma CVD process using oxygen, a low-pressure CVD process using ozone, or an ordinary-pressure CVD process. Then, an interlevel dielectric film 164 with good step coverage can be obtained. On the other hand, if a silicon nitride film is deposited by plasma CVD process using $SiH_4$ and $NH_3$ as source gases, then the number of dangling bonds, which would deteriorate the TFT performance, can be reduced effectively because hydrogen atoms are supplied to the interface between the active regions and the gate insulating film.

Next, contact holes are cut through the interlevel dielectric film 164 and then get metalized with a metallic material (e.g., a stack of titanium nitride and aluminum films), thereby forming electrodes/interconnects 165 for the TFT. The titanium nitride film is provided as a barrier film that will prevent aluminum from diffusing and entering the semiconductor layer 155. In this manner, a thin-film transistor 166 is obtained.

If this thin-film transistor 166 is used as a pixel switching element, one of the electrodes/interconnects 165 (i.e., drain electrode) is electrically connected to a pixel electrode made of a transparent conductive film of ITO, for example. In that case, the other electrode/interconnect will be used as a source bus line, through which a video signal is supplied. And in response to a gate signal supplied through a gate bus line provided by the gate electrode 157, necessary electrical charge is written on the pixel electrode. Optionally, the thin-film transistor 166 can also be used in a thin-film integrated circuit, for example. In that case, another contact hole needs to be provided over the gate electrode 157 and an interconnect required needs to be provided.

Finally, this structure is subjected to an annealing process at 400° C. for an hour within a nitrogen or hydrogen atmosphere, thereby completing the thin-film transistor 166. If necessary, the thin-film transistor 166 may be covered with a passivation film of silicon nitride, for example, to protect the thin-film transistor 166.

Embodiment 2

Hereinafter, a second specific preferred embodiment of the present invention will be described with reference to the accompanying drawings. In the following description of the second preferred embodiment, it will be described how to fabricate a circuit with a CMOS structure, in which an n-channel TFT and a p-channel TFT are arranged to operate complementarily with each other and which will be used as a peripheral driver circuit for an active-matrix-addressed LCD or an ordinary thin-film circuit, on a glass substrate.

FIGS. 8(A) through 8(G) are schematic cross-sectional views illustrating respective manufacturing process steps to fabricate an n-channel TFT and a p-channel TFT according to this preferred embodiment.

Figure 8:
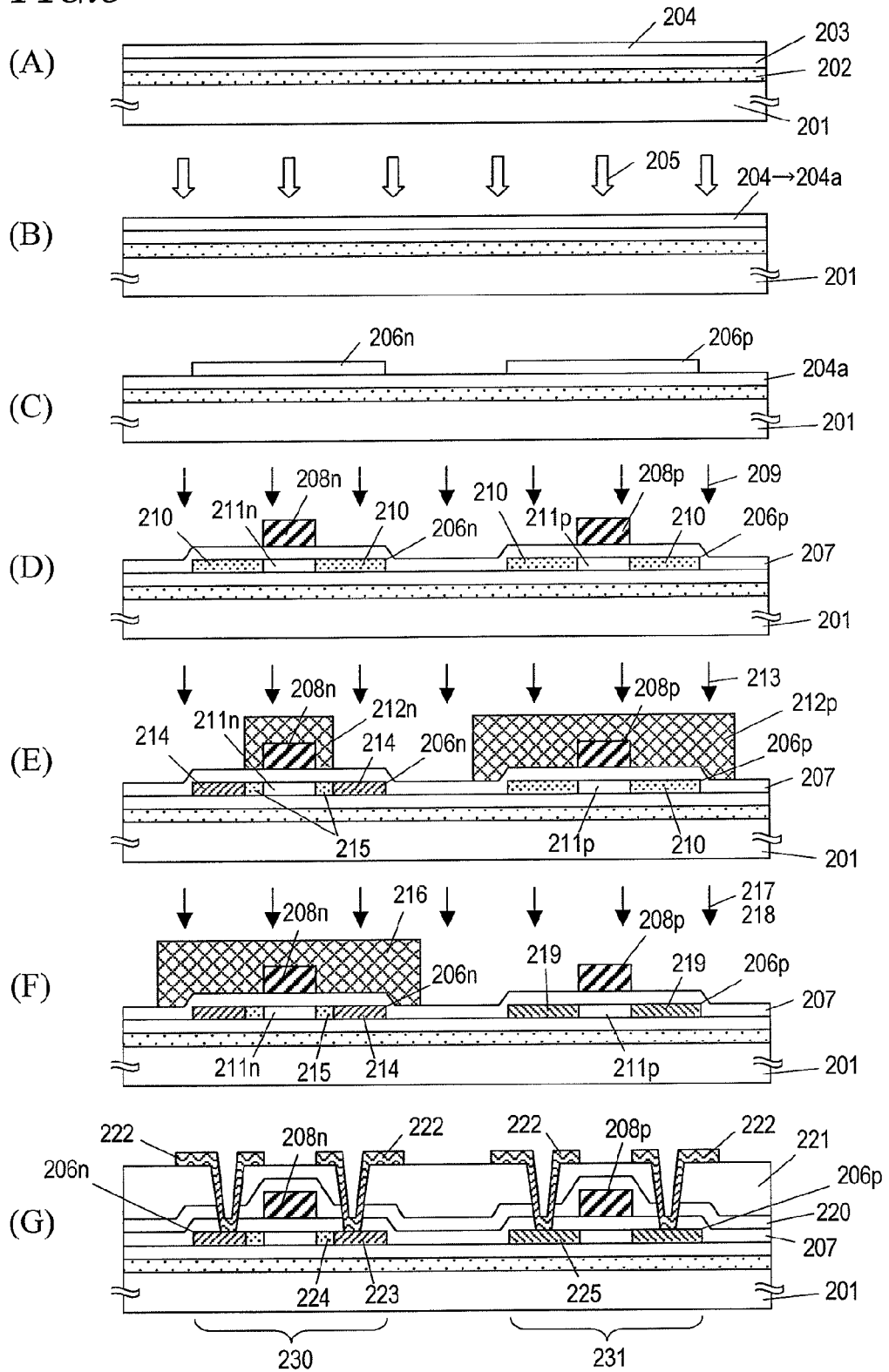
FIGS. 8(A) through 8(G) are schematic cross-sectional views illustrating respective process steps to fabricate a thin-film transistor according to a second preferred embodiment of the present invention.

First of all, as shown in FIG. 8(A), first and second undercoat films 202 and 203 are deposited in this order on the surface of a substrate 201 to prevent impurities from diffusing from the glass substrate. And then a silicon film with an amorphous structure (i.e., an amorphous silicon film 204) is deposited thereon.

In this preferred embodiment, a low alkali glass substrate is used as the substrate 201, which may be heat-treated in advance to a temperature that is lower than the glass strain point by about 10-20° C. Also, a silicon oxynitride film is deposited as the lower, first undercoat film 202 by performing a plasma CVD process with source gases of $SiH_4$, $NH_3$ and $N_2O$ supplied, and then a silicon dioxide film is deposited thereon as the upper, second undercoat film 203 by performing a plasma CVD process again with source gases of $SiH_4$ and $N_2O$ supplied. In this preferred embodiment, the silicon oxynitride film as the first undercoat film 202 has a thickness of 25 nm to 200 nm (e.g., 100 nm) and the silicon dioxide film as the second undercoat film 203 has a thickness of 25 nm to 300 nm (e.g., 100 nm). Although a two-layered undercoat film is used in this preferred embodiment, a single layer of silicon dioxide may also be used.

The silicon film (amorphous silicon film) 204 may be formed by performing a plasma CVD process using a silane gas as a source gas, for example. The amorphous silicon film 204 may have a thickness of 20 nm to 150 nm (preferably in the range of 30 nm to 80 nm). In this preferred embodiment, an amorphous silicon film 204 is deposited to a thickness of 50 nm. Optionally, the undercoat films 202 and 203 and the amorphous silicon film 204 may be deposited continuously. In that case, if a plasma CVD system with multiple chambers is used, then the undercoat films 202 and 203 may be deposited first, and then the amorphous silicon film 204 can be formed with the substrate 201 left in the same chamber. That is to say, as the surface of the undercoat film 203 is not exposed to the air, contamination on its surface can be avoided and variations in performance or the threshold voltage between the TFTs, which could be caused by such contamination, can be minimized.

Next, as shown in FIG. 8(B), the amorphous silicon film 204 is irradiated with a laser beam 205 to get crystallized and form a crystalline silicon film 204*a*. In this preferred embodiment, the laser beam 205 may be an XeCl excimer laser beam (with a wavelength of 308 nm and a pulse width of 40 nsec) that has been radiated with an energy density of 250-500 mJ/cm$^2$ (e.g., 400 mJ/cm$^2$). If necessary, the substrate 201 may be heated while being irradiated with the laser beam 205. The laser beam has been shaped so as to leave an elongated beam spot of 300 mm×0.4 mm on the surface of the substrate 201. By sequentially scanning the surface of the substrate with the laser beam at a step width of 0.02 mm perpendicularly to the direction in which the beam spot is elongated, an arbitrary point of the amorphous silicon film 204 is irradiated with the laser beam 20 times in total. As the laser beam, a KrF excimer laser beam, an XeCl excimer laser beam, a YAG laser beam or a YVO$_4$ laser beam of either a pulse oscillation type or a continuous wave type may be used. The crystallization conditions may be determined appropriately by the person who carries out this process.

Thereafter, excessive parts of the crystalline silicon film 204*a* are removed to get electrical isolation done between respective devices, thereby forming islands 206*n* and 206*p* of semiconductor layer, each of which will be the active regions (i.e., source/drain regions and a channel region) of an n-channel TFT or a p-channel TFT, as shown in FIG. 8(C).

In this process step, a dopant element (which may be boron (B)) that will produce p-type conduction may be added at a dose of approximately $1\times10^{16}$ to $5\times10^{17}$/cm$^3$ to the entire surface of the active regions of the n-channel and p-channel TFTs in order to control the threshold voltage. Boron may be either added by performing an ion doping process or added in advance when the amorphous silicon film 204 is formed.

Subsequently, as shown in FIG. 8(D), a gate insulating film 207 is deposited over the islands 206*n* and 206*p* of semiconductor layer, and then gate electrodes 208*n* and 208*p* are formed thereon so as to mask the respective regions of the islands 206*n* and 206*p* of semiconductor layer to be channel regions. In this preferred embodiment, a silicon dioxide film is deposited to a thickness of 20-150 nm (e.g., 80 nm) as the gate insulating film 207. The silicon dioxide film may be formed by decomposing and depositing TEOS as a source gas, along with oxygen, by RF plasma CVD process. Then, the substrate is preferably heated to a temperature of 300-450° C. The gate insulating film 207 may be any other insulating film including silicon and may have either a single-layer structure era multilayer structure.

The gate electrodes 208*n* and 208*p* may be formed by depositing a refractory metal on the gate insulating film 207 by sputtering process and then patterning it. As the refractory metal, an element selected from the group consisting of tantalum (Ta), tungsten (W), molybdenum (Mo) and titanium (Ti), an alloy consisting essentially of that element, or an alloy film including at least two of these elements in combination (which is typically an Mo—W alloy film or an Mo—Ta alloy film) may be used. Or tungsten silicide, titanium silicide or molybdenum silicide could also be used. In this preferred embodiment, gate electrodes 208*n* and 208*p* of tungsten (W) are formed so as to have a thickness of 300-600 nm (e.g., 450 nm). In this process step, the impurity concentration in the gate electrodes 208*n* and 208*p* is preferably decreased to reduce the resistance in the gate electrodes 208*n* and 208*p*. For example, by decreasing the oxygen concentration to 30 ppm or less, a resistivity of 20 μΩcm or less is realized.

Thereafter, using the gate electrodes 208*n* and 208*p* as a mask, the semiconductor layers 206*n* and 206*p* are lightly doped with a dopant (such as ions of phosphorus 209) by ion doping process. In this preferred embodiment, phosphine (PH$_3$) is used as a doping gas, an acceleration voltage of 50-90 kV (e.g., 80 kV) is applied, and an implant dose is set within the range of $1\times10^{12}$ to $1\times10^{14}$ cm$^{-2}$ (e.g., $2\times10^{13}$ cm$^{-2}$). As a result of this process step, portions of the islands 206*n* and 206*p* of semiconductor layer that are not masked with the gate electrodes 208*n* and 208*p* turn into regions 210 that have been lightly doped with the dopant 209. On the other hand, the other portions of the islands 206*n* and 206*p* of semiconductor layer that are masked with the gate electrodes 208*n* and 208*p* and have not been doped with the dopant 209 will eventually be channel regions 211*n* and 211*p* for n-channel and p-channel TFTs.

Next, a mask 212*n* of photoresist is formed in a size that is big enough to easily mask the gate electrode 208*n*, which will form part of an n-channel TFT, with some margin left as shown in FIG. 8(E). In addition, another mask 212*p* of photoresist is also formed in a size that is big enough to easily mask the semiconductor layer 206*p* entirely, which will form part of a p-channel TFT, with some margin left. Thereafter, the semiconductor layers 206*n* and 206*p* are implanted with dopant (phosphorus) ions 213 heavily by performing an ion doping process using the masks 212*n* and 212*p* as a doping mask. In this process step, phosphine (PH$_3$) is used as a doping gas, the accelerating voltage is defined within the range of 50 kV to 80 kV (e.g., 70 kV), and the dose is defined to fall within the range of $2\times10^{15}$ cm$^{-2}$ to $1\times10^{16}$ cm$^{-2}$ (e.g., $5\times10^{15}$ cm$^{-2}$).

As a result of this process step, in the semiconductor layer 206*n* to be the active region of an n-channel TFT, regions 214 that have been heavily doped with dopant (phosphorus) 213 will be source/drain regions. On the other hand, the other regions 215 of the same semiconductor layer 206*n*, which have been covered with the mask 212*n* and Have not been heavily doped with phosphorus ions 213, remain lightly doped with phosphorus, and will be lightly doped drain (LDD) regions. In this process step, the concentration of the n-type dopant element (phosphorus) 213 in the regions 214 is in the range of $1\times10^{19}$/cm$^3$ to $1\times10^{21}$/cm$^3$. Meanwhile, in the regions 215, the concentration of the n-type dopant element (phosphorus) 209 is in the range of $1\times10^{17}$/cm$^3$ to $1\times10^{20}$/cm$^3$. In other words, if the dopant concentration falls within this range, those regions function as LDD regions. In this process step, the entire semiconductor layer 206*p* to be the active region of a p-channel TFT is covered with the mask 212*p*, and therefore, is not implanted with the dopant (phosphorus) ions 213.

Figure 15:
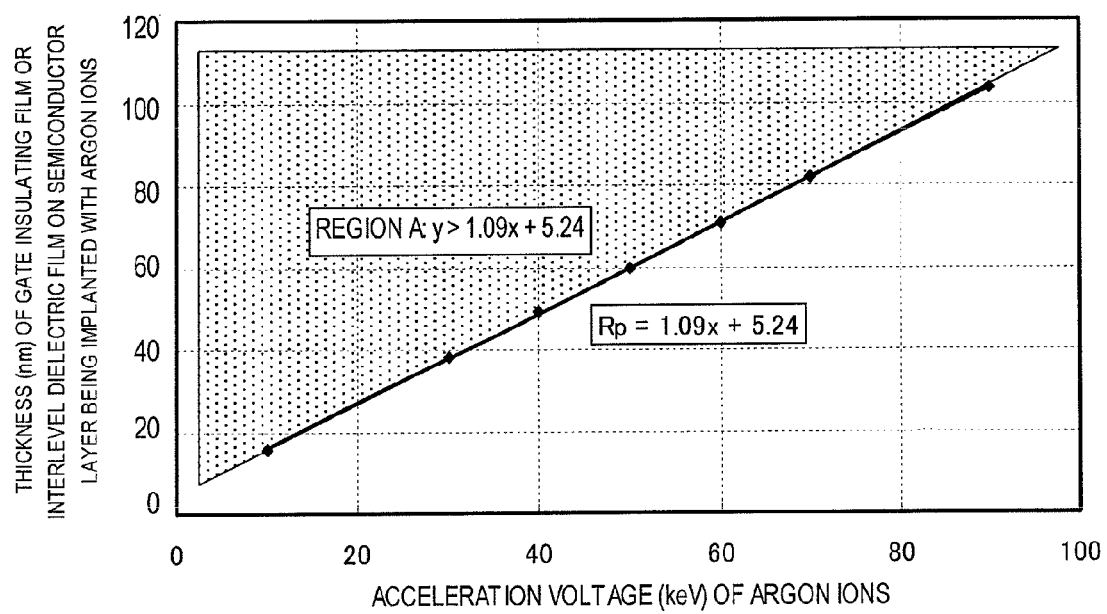
FIG. 15 shows how the thickness of a gate insulating film or an interlevel dielectric film on a semiconductor layer changes with the acceleration voltage of argon ions being implanted into the semiconductor layer.

Next, after the masks 212*n* and 212*p* have been removed, another mask 216 of photoresist is formed as shown in FIG. 8(F) to cover entirely the semiconductor layer 206*n* to be the active region of the n-channel TFT. In this process step, no mask is provided over the semiconductor layer 206*p* to be the active region of a p-channel TFT. In such a state, the semiconductor layer 206*p* is implanted with argon ions 218 and ions of boron 217 that will give p-type conduction to the semiconductor layer 206*p* at the same time by performing an ion doping process using the photoresist mask 216 and the gate electrode 208*p* as a doping mask. In this process step, a mixture of diborane (B$_2$H$_6$) and argon (Ar) gases is used as a doping gas, the accelerating voltage is defined within the range of 20 kV to 70 kV (e.g., 60 kV), and the dose is defined to fall within the range of $1\times10^{14}$ cm$^{-2}$ to $1\times10^{16}$ cm$^{-2}$ (e.g., $2.5\times10^{15}$ cm$^{-2}$). In this process step, the acceleration voltage (keV) is appropriately determined so that the thickness y (nm) of the gate insulating film 207 that is located over the semiconductor layer to be implanted with argon and boron ions 218 and 217 falls within the range A in which the inequality y>1.09x+5.24 is satisfied as shown in FIG. 15. As a result, the peak depth Rp of the argon atoms 218 can be located inside the gate insulating film 207.

As a result of this process step, the semiconductor layer 206p to be the active region of a p-channel TFT is heavily doped with ions of boron 217 and argon 218 except the channel region 211p under the gate electrode 208p. Also, as a result of this process step, the n-type dopant (phosphorus) 209 that has been added lightly in the previous process step has its conductivity type inverted by the boron ions 217 implanted into p-type, thereby defining regions that will be the source/drain regions 219 of a p-channel TFT. Argon 218 is an inactive element, and therefore, does not affect the carrier distribution in the semiconductor. But damage done by the implantation of the argon ions still causes some crystal destruction on the regions 219. In the regions 219, the boron atoms 217 may have a concentration of $1.5\times10^{19}$ atom/cm$^3$ to $3\times10^{21}$ atom/cm$^3$ and the rare-gas element (Ar atoms) 218 may have a concentration of $1\times10^{19}$ atom/cm$^3$ to $1\times10^{21}$ atom/cm$^3$.

Figure 9:
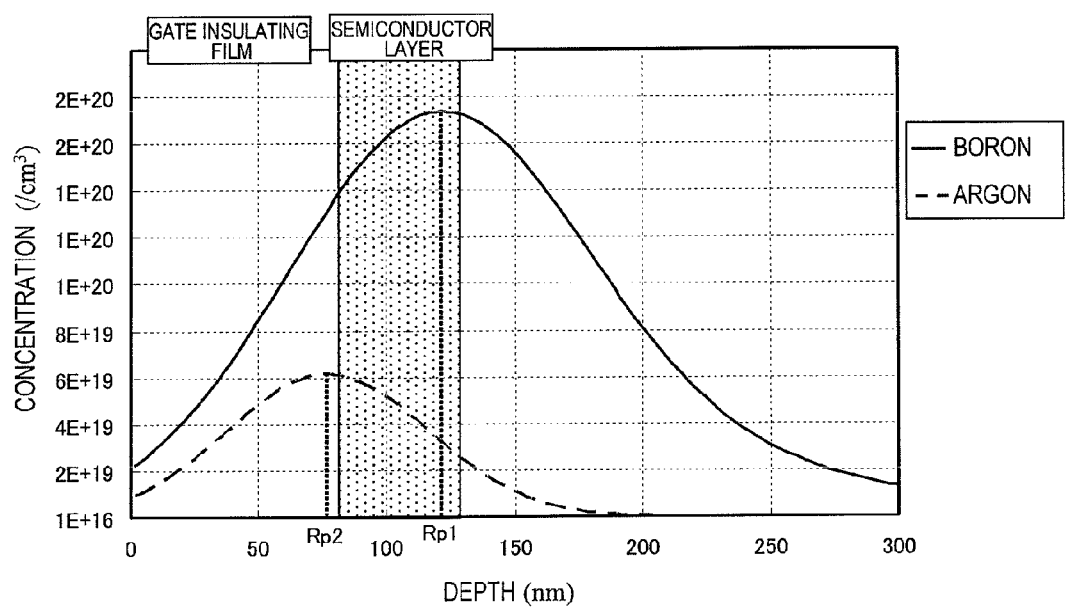
FIG. 9 illustrates the concentration profiles of boron and argon atoms that have been introduced into the source/drain regions of the thin-film transistor as the second preferred embodiment of the present invention.
Figure 10:
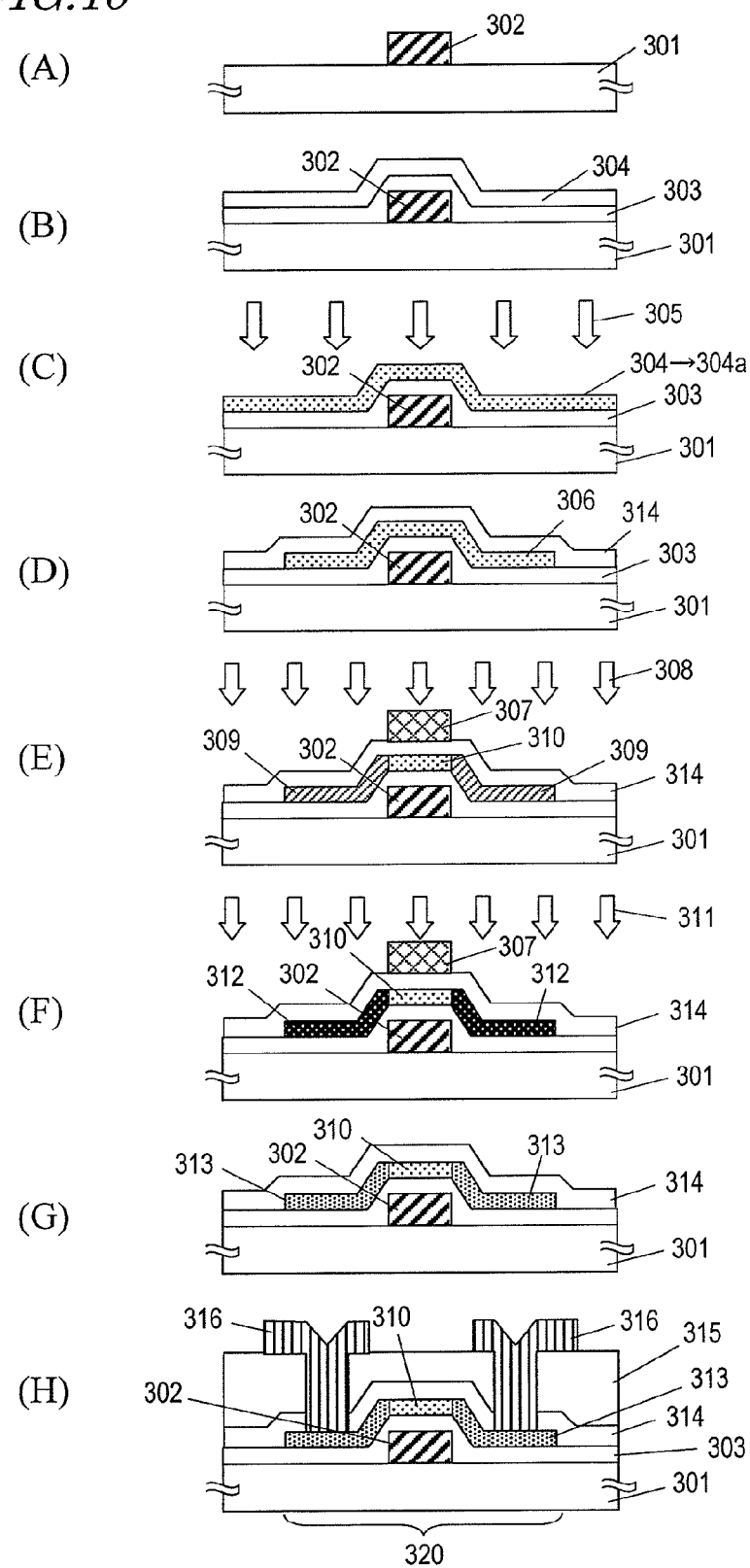
FIGS. 10(A) through 10(H) are schematic cross-sectional views illustrating respective process steps to fabricate a thin-film transistor according to a third preferred embodiment of the present invention.

The concentration profiles in the depth direction of the boron atoms 217 and argon atoms 218 that have been added to the semiconductor layer 206p to be the active region of a p-channel TFT are shown in FIG. 9. As can be seen from FIG. 9, the peak depth Rp1 of the boron atoms 217 is located under the semiconductor layer 206p. On the other hand, the peak depth Rp2 of the argon atoms 218 is located inside the gate insulating film 207 over the semiconductor layer 206p. In the preferred embodiment described above, the semiconductor layer 206p is implanted with boron and argon ions 217 and 218 at the same time using a mixture of diborane (B$_2$H$_6$) and argon (Ar) gases. However, as in the first preferred embodiment described above, boron and argon ions 217 and 218 may be implanted separately. As the rare-gas element, one or more rare-gas elements selected from the group consisting of Ar, Kr and Xe may be used.

In adding the n-type and p-type dopants, each of these elements may be selectively added with the regions not to be doped masked with photoresist as described above, thereby defining regions 214 that have been heavily doped with an n-type dopant and regions 219 that have been doped with a p-type dopant. In the preferred embodiment described above, the n-type dopant element is added to the semiconductor layers 206p and 206n earlier. However, the order of the implantation process steps to perform is not limited to the one adopted in this preferred embodiment but may be determined appropriately by the person who carries out the process. Also, the rare-gas element may be added either before or after the process step of adding the n-type or p-type element or simultaneously with the process step of adding any of these dopants.

Thereafter, the mask 216 is removed and then the substrate is thermally treated within an inert atmosphere (e.g., a nitrogen gas ambient). In this preferred embodiment, an RTA process is carried out so that the temperature of the substrate is increased or decreased instantaneously by loading substrates 201 one after another into a high-temperature atmosphere and spraying a high-temperature nitrogen gas against the surface of the substrate. The heat treatment process may be carried out at a temperature rise/fall rate exceeding 200° C. per minute (e.g., at 650° C. for 10 minutes). In this process step, any other type of heat treatment may also be carried out and its conditions may also be defined appropriately by the person who carries out the process. It is naturally possible to carry out a normal heat treatment process using a diffusion furnace or an RTA process that uses a lamp.

As a result of this heat treatment process, the n-type dopant (phosphorus) 209, 213 that has been introduced to the regions 214 and 215 of the semiconductor layer 206n to be the active regions of an n-channel TFT and the p-type dopant (boron) 217 that has been added to the regions 219 to be the active regions of a p-channel TFT are activated to be source/drain regions 223 of an n-channel TFT, LDD regions 224 and source/drain regions 225 of a p-channel TFT, respectively, as shown in FIG. 8(G). In this process step, the regions 219 to be the source/drain regions of a p-channel TFT get re-crystallized so as to repair the crystal destruction caused by the argon ions 218 that have been implanted simultaneously with the dopant ions 217. As a result, the boron atoms 217 are caught in interstitial sites of Si and are activated efficiently. Consequently, the source/drain regions 223 of the n-channel TFT will have a sheet resistance of approximately 400 to 700Ω/□, the LDD regions 224 will have a sheet resistance of approximately 60 to 100 kΩ/□, and the source/drain regions 225 of the p-channel TFT will have a sheet resistance of approximately 0.7 to 1.0 kΩ/□.

Next, interlevel dielectric films 220 and 221 are deposited over the gate electrodes 208n and 208p and then electrodes and interconnects 222 are formed for respective TFTs.

As the interlevel dielectric film 221, silicon nitride, silicon dioxide or silicon oxynitride is deposited to a thickness of 400 nm to 1,500 nm (typically in the range of 600 nm to 1,000 nm). In this preferred embodiment, the interlevel dielectric film has a dual layer structure in which a silicon nitride film 220 and a silicon dioxide film 221 have been continuously deposited in this order to thicknesses of 200 nm and 700 nm, respectively. However, the materials and structure of the interlevel dielectric films 220 and 221 are not limited to these. Alternatively, the interlevel dielectric films 220 and 221 may also have either a single or multilayer structure including any other insulating film with silicon.

Furthermore, a heat treatment process is carried out at a temperature of 300° C. to 500° C. for approximately one hour to hydrogenate the semiconductor layers. As a result, hydrogen atoms are supplied to the interface between the active regions and the gate insulating film 207 through the interlevel dielectric film (such as the silicon nitride film 220, in particular), thereby terminating and inactivating dangling bonds that would deteriorate the performance of a TFT. In this preferred embodiment, the heat treatment was conducted at 400° C. for an hour within a nitrogen gas ambient.

Next, contact holes are cut through the interlevel dielectric films 220 and 221 and metallic materials (such as a stack of titanium nitride and aluminum) are deposited and patterned into electrodes and interconnects 222 for TFTs. The titanium nitride film is provided as a barrier film that prevents aluminum from diffusing and entering the semiconductor layers. Finally, the structure thus obtained is annealed at 350° C. for an hour, thereby completing an n-channel thin-film transistor 230 and a p-channel thin-film transistor 231. If necessary, contact holes may also be cut over the gate electrodes 208n and 208p and the electrodes may be connected together with the interconnects 222 as needed. Optionally, to protect the TFTs, a passivation film of silicon nitride may also be deposited over these thin-film transistors 230 and 231.

Embodiment 3

Hereinafter, a third preferred embodiment of the present invention will be described with reference to the accompanying drawings. In the preferred embodiments of the present invention described above, TFTs with a top gate structure are fabricated. On the other hand, the preferred embodiment to be described below is a method for fabricating a p-channel TFT with a bottom gate structure on a glass substrate. The TFT of this preferred embodiment can be used not only as a pixel switching element or a driver circuit component for an active-matrix-addressed LCD or an organic EL display device but also as a component of a thin-film integrated circuit.

FIGS. 10(A) through 10(H) are schematic cross-sectional views illustrating respective process steps to fabricate a p-channel TFT according to this preferred embodiment.

First, as shown in FIG. 10(A), a gate electrode 302 is formed on a glass substrate 301. Considering its thermal resistance that the metal film will have to exhibit later during a heat treatment process, the material of the gate electrode 302 is preferably a refractory metal such as tantalum (Ta), tungsten (W), or molybdenum (Mo), for example. The gate electrode 302 preferably has a thickness of 200 to 500 nm. In this preferred embodiment, a Mo film was deposited by sputtering and then patterned, thereby forming a gate electrode 302 with a thickness of 350 nm, for example.

Next, as shown in FIG. 10(B), a gate insulating film 303 and an intrinsic (i-type) amorphous silicon film 304 are deposited in this order over the gate electrode 302.

In this preferred embodiment, a silicon dioxide film is deposited to a thickness of 20-150 nm (e.g., 100 nm) as the gate insulating film 303. The silicon dioxide film may be formed by decomposing and depositing TEOS as a source gas along with oxygen by RF plasma CVD process. Then, the substrate is preferably heated to a temperature of 300-450° C. The amorphous silicon (a-Si) film 304 may be formed by plasma CVD process, and may have a thickness of approximately 20-80 nm, e.g., 50 nm. In this process step, if the gate insulating film 303 and the amorphous silicon film 304 are deposited continuously inside the same vacuum chamber, then the interface between the amorphous silicon film 304 and the gate insulating film 303, which will be a channel interface that is the most important part that determines the performance of a TFT completed, can be kept clean. As a result, the interfacial property can be improved.

Next, as shown in FIG. 10(C), the amorphous silicon film 304 is irradiated with a laser beam 305 to get crystallized and form a crystalline silicon film 304a. The laser beam 305 may be an XeCl excimer laser beam (with a wavelength of 308 nm and a pulse width of 40 nsec) or a KrF excimer laser beam (with a wavelength of 248 nm). The laser beam 305 has been shaped so as to leave an elongated beam spot on the surface of the substrate 301. By sequentially scanning the surface of the substrate with the laser beam perpendicularly to the direction in which the beam spot is elongated, the entire surface of the substrate can get crystallized. In this process step, if the substrate gets scanned so that the beam spots partially overlap with each other, an arbitrary point of the amorphous silicon film 304 is irradiated with the laser beam a number of times. As a result, the degree of uniformity can be increased. The energy of the laser beam 305 needs to be determined to fall within an appropriate range because too low energy would result in an insufficient degree of crystallization but too high energy would further amorphize the amorphous silicon film.

Thereafter, as shown in FIG. 10(D), excessive parts of the crystalline silicon film 304a are removed to get electrical isolation done between respective devices, thereby forming islands 306 of semiconductor layer, each of which will be the active regions (i.e., source/drain regions and a channel region) of a TFT. Subsequently, an interlevel dielectric film 314 is deposited over the islands 306 of semiconductor layer.

Any material may be deposited as the interlevel dielectric film 314 but could be a silicon dioxide film or a silicon nitride film with a thickness of 10 to 100 nm, for example. In this preferred embodiment, a silicon dioxide film is deposited to a thickness of 30 nm.

Next, as shown in FIG. 10(E), a photoresist mask 307 is formed on the interlevel dielectric film 314 and then ions of a p-type dopant (such as boron) 308 are implanted into the islands 306 of semiconductor layer by ion doping process.

The mask 307 can be formed by depositing a photoresist film over the interlevel dielectric film 314 so that the photoresist film covers the islands 306 of semiconductor layer, exposing the photoresist film to a radiation that has come from under the lower surface of the substrate using the gate electrode 302 as a mask, and then removing the exposed portions. The mask 307 is formed so as to be self-aligned with the gate electrode 302, and therefore, has the shape corresponding to that of the gate electrode 302.

As a result of this process step, the ions of boron 308 pass through the interlevel dielectric film 314 to get implanted into regions 309 of the semiconductor layer 306 that are exposed through the mask 307. Those regions 309 will be source/drain regions later. On the other hand, the other region 310 of the island 306 of semiconductor layer that has been hidden behind the mask 307 and has not been implanted with the boron ions 308 will be a channel region of a TFT. In this preferred embodiment, this process step is carried out using diborane ($B_2H_6$) as a doping gas at an acceleration voltage of 10-60 kV (e.g., 40 kV) and at an implant dose of $1\times10^{14}$ to $8\times10^{15}$ cm$^{-2}$ (e.g., $2\times10^{15}$ cm$^{-2}$).

Subsequently, as shown in FIG. 10(F), argon ions 311 are implanted as a rare-gas element into the island 306 of semiconductor layer by ion doping process using the mask 307 as a doping mask, thereby decreasing the degree of crystallinity of the regions 309 and defining regions 312. In this preferred embodiment, argon is used as a doping gas, an acceleration voltage of 5-25 kV (e.g., 10 kV) is applied, and the implant dose is determined within the range of $1\times10^{13}$ to $8\times10^{15}$ cm$^{-2}$ (e.g., $1\times10^{15}$ cm$^{-2}$).

In this process step, the acceleration voltage of the argon ions 311 is determined by the thickness of the interlevel dielectric film 314, which the argon ions 311 should pass through during the doping process, so that the peak depth Rp of the argon ions 311 will be located within the interlevel dielectric film 314. Specifically, supposing x represents the acceleration voltage (keV) at which the argon ions 311 are implanted and y represents the thickness (nm) of the interlevel dielectric film 314 on the semiconductor layer, the acceleration voltage x and the thickness y of the interlevel dielectric film 314 preferably fall within the range A in which the inequality y>1.09x+5.24 is satisfied as shown in FIG. 15. That is to say, the acceleration voltage x is appropriately determined so as to satisfy this inequality.

Figure 11:
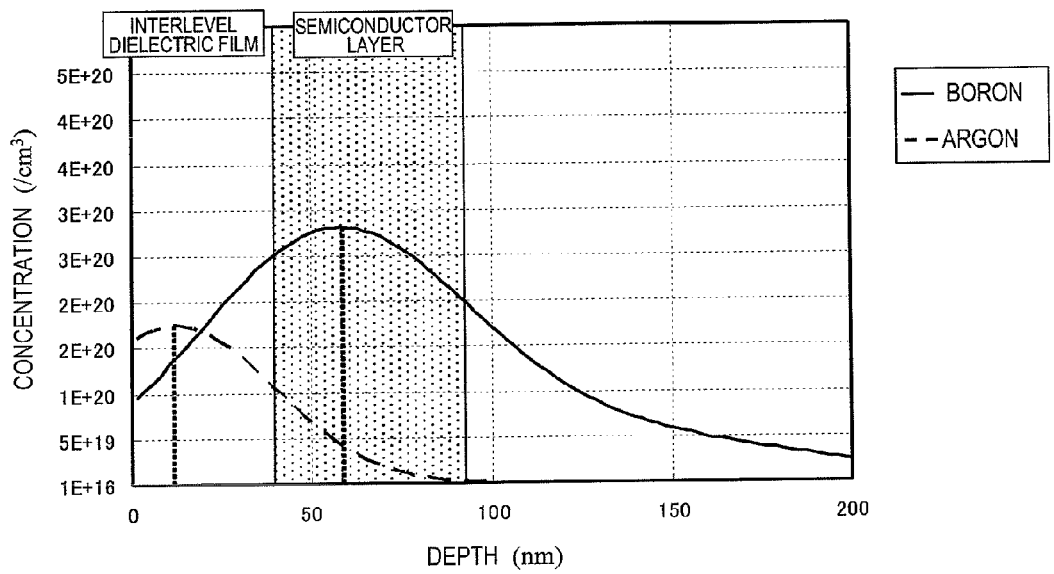
FIG. 11 illustrates the concentration profiles of boron and argon atoms that have been introduced into the source/drain regions of the thin-film transistor as the third preferred embodiment of the present invention.

The concentration profiles in the depth direction of the boron atoms 308 and the argon atoms 311 to be added to the island 306 of semiconductor layer during this doping process step are shown in FIG. 11. As can be seen from FIG. 11, the peak depth Rp1 of the boron atoms 308 is located at a depth of approximately 60 nm under the surface of the interlevel dielectric film 314, which corresponds to a depth of approximately 30 nm under the surface of the semiconductor layer 306. Since the peak depth Rp1 of the boron atoms 308 is located inside the semiconductor layer 306 according to this preferred embodiment, the boron concentration can be increased in the regions 312 to be source/drain regions. On the other hand, the peak depth Rp2 of the argon atoms 311 is located inside the interlevel dielectric film 314. In this case, the concentration profile of the argon atoms 311 decreases continuously from the upper surface of the semiconductor layer 306 toward the lower surface thereof. As a result, crystal destruction can be caused by the argon ions 311 on the upper portion of the regions 312 with a sufficient degree of crystallinity maintained in the lower portion of the regions 312.

In this preferred embodiment, the process step of implanting ions of boron 308 is carried out earlier than the process step of implanting ions of argon 311. However, the process step of implanting ions of argon 311 may be performed earlier than the process step of implanting ions of boron 308. Also, in the preferred embodiment described above, ions of argon (Ar) are implanted as a rare-gas element. Alternatively, krypton (Kr) or xenon (Xe) may be used instead.

Thereafter, the mask 307 is removed and then a heat treatment process is carried out within an inert atmosphere (such as a nitrogen gas ambient). This heat treatment process may be carried out using a normal heat treatment furnace but is preferably performed as an RTA process. Among other things, an RTA system designed to increase and decrease the temperature of the substrate instantaneously by spraying a high-temperature inert gas toward the surface of the substrate is particularly preferred.

As a result of this heat treatment process, in the regions 312 where crystal destruction has been caused by the implantation of boron and argon ions 308 and 311, re-crystallization advances from the crystal grains, which remain around the lower surface of the region 312, as seed crystals. And during this re-crystallization, the boron atoms 308 get caught in the interstitial sites between silicon atoms and are activated efficiently. As a result, the regions 312 have their resistance reduced to be source/drain regions 313 for a TFT as shown in FIG. 10(G).

The source/drain regions 313 thus defined have a sheet resistance of approximately 0.5 to 0.8 k$\Omega$/□. When the conventional process was performed just as described above except that argon ions were not implanted, the source/drain regions had a sheet resistance of approximately 1.5 to 2.0 k$\Omega$/□. Thus, it can be seen that according to this preferred embodiment, the resistance can be reduced to approximately one third to one half compared to the conventional process.

Thereafter, as shown in FIG. 10(H), another interlevel dielectric film 315 is deposited to a thickness of approximately 600 nm on the interlevel dielectric film 314. The interlevel dielectric film 315 may be either a silicon dioxide film or a silicon nitride film, for example. If a silicon dioxide film is deposited by using TEOS as a source gas and decomposing and depositing it through a plasma CVD process using oxygen, a low-pressure CVD process using ozone, or an ordinary-pressure CVD process, an interlevel dielectric film 315 with good step coverage can be obtained. On the other hand, if a silicon nitride film is deposited by plasma CVD process using $SiH_4$ and $NH_3$ as source gases, then the number of dangling bonds, which would deteriorate the TFT performance, can be reduced effectively because hydrogen atoms are supplied to the interface between the active regions and the gate insulating film.

Next, contact holes are cut through the interlevel dielectric films 314 and 315 and then get metalized with a metallic material (e.g., a stack of titanium nitride and aluminum films), thereby forming electrodes/interconnects 316 for the TFT. The titanium nitride film is provided as a barrier film that will prevent aluminum from diffusing and entering the semiconductor layer. If the thin-film transistor thus obtained is used as a pixel switching element, one of the electrodes/interconnects 316 (i.e., drain electrode) is electrically connected to a pixel electrode made of a transparent conductive film of ITO, for example. In that case, the other electrode/interconnect will be used as a source bus line, through which a video signal is supplied. And in response to a gate signal supplied through a gate bus line provided by the gate electrode 302, necessary electrical charge is written on the pixel electrode. Optionally, the thin-film transistor can also be used in a thin-film integrated circuit, for example. In that case, another contact hole needs to be provided over the gate bus line defined by the gate electrode 302 and an interconnect required needs to be provided.

Finally, this structure is subjected to an annealing process at 400° C. for an hour within a nitrogen or hydrogen atmosphere, thereby completing a thin-film transistor 320. If necessary, the thin-film transistor 320 may be covered with a passivation film of silicon nitride, for example, to protect the thin-film transistor 320.

Embodiment 4

Hereinafter, it will be described how to fabricate a thin-film transistor according to a fourth specific preferred embodiment of the present invention. In this preferred embodiment, a thin-film transistor is fabricated just as already described for the first preferred embodiment with reference to FIG. 6 except that boron is added so that the concentration profile of the boron added will have a peak under the semiconductor layer.

According to this preferred embodiment, the semiconductor layer is implanted with ions of boron and argon in this order from over the gate insulating film using the gate electrode as a mask as in the first preferred embodiment described above. In this preferred embodiment, the boron doping process step is carried out at an acceleration voltage of 40-90 kV (e.g., 80 kV) and at an implant dose of $1\times10^{15}$ to $8\times10^{15}$ cm$^{-2}$ (e.g., $2\times10^{15}$ cm$^{-2}$). On the other hand, the argon doping process step is carried out under the same conditions as in the first preferred embodiment.

Figure 12:
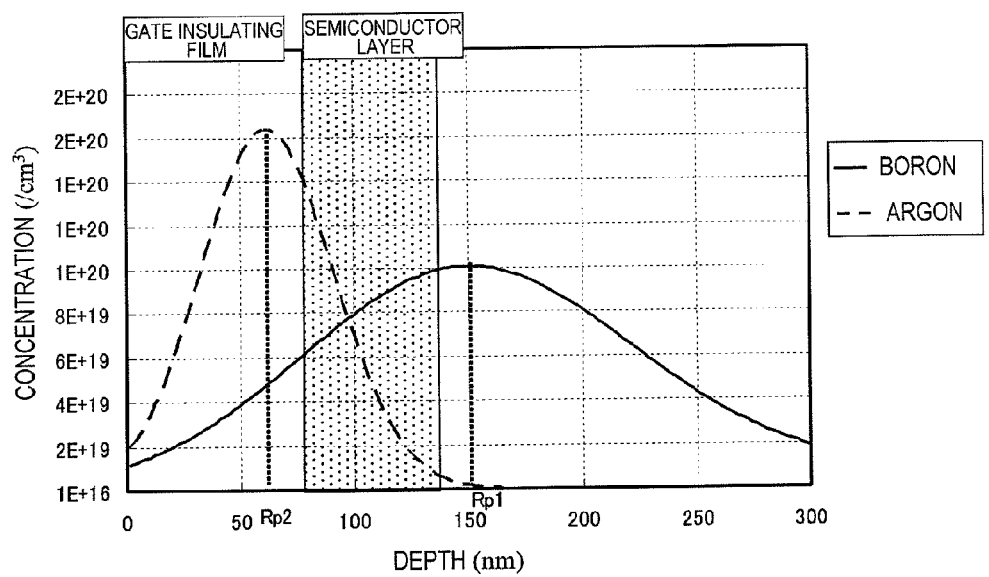
FIG. 12 illustrates the concentration profiles of boron and argon atoms that have been introduced into the source/drain regions of a thin-film transistor according to a fourth preferred embodiment of the present invention.

The concentration profiles in the depth direction of boron and argon atoms added during this doping process step are shown in FIG. 12. As can be seen from FIG. 12, the peak depth Rp1 of boron is located at a depth of approximately 150 nm under the upper surface of the gate insulating film, which corresponds to a depth of approximately 20 nm over the lower surface of the semiconductor layer. Thus, the boron concentration has a profile that increases continuously from the upper surface of the semiconductor layer toward the lower surface thereof. On the other hand, the argon concentration has a peak Rp2 inside the gate insulating film and decreases continuously from the upper surface of the semiconductor layer toward the lower surface thereof as in the first preferred embodiment described above.

Thereafter, a heat treatment process (i.e., an activating annealing process) is carried out as in the first preferred embodiment described above. The source/drain regions thus defined had a sheet resistance of about 0.5 to 0.8 k$\Omega$/□. When the conventional process was performed just as described above except that argon ions were not implanted, the source/drain regions had a sheet resistance of approximately 1.5 to 2.0 k$\Omega$/□. Thus, it can be seen that according to this preferred embodiment, the sheet resistance could be reduced to approximately one third to one half compared to the conventional process.

In this preferred embodiment, the process step of adding boron is carried out earlier than the process step of adding argon. However, the process step of adding argon may be performed earlier than the process step of adding boron. Also, in the preferred embodiment described above, ions of argon (Ar) are implanted. Alternatively, krypton (Kr) or xenon (Xe) may be used instead.

Embodiment 5

Hereinafter, it will be described how to fabricate a thin-film transistor according to a fifth specific preferred embodiment of the present invention. In this preferred embodiment, a thin-film transistor is fabricated just as already described for the third preferred embodiment with reference to FIG. 10 except that boron is added so that the concentration profile of the boron added will have a peak under the semiconductor layer.

According to this preferred embodiment, the semiconductor layer is implanted with ions of boron and argon in this order from over the photoresist mask and through the interlevel dielectric film as in the third preferred embodiment described above. In this preferred embodiment, the boron doping process step is carried out at an acceleration voltage of 10-60 kV (e.g., 50 kV) and at an implant dose of $1 \times 10^{14}$ to $8 \times 10^{15}$ cm$^{-2}$ (e.g., $2 \times 10^{15}$ cm$^{-2}$). On the other hand, the argon doping process step is carried out under the same conditions as in the third preferred embodiment.

Figure 13:
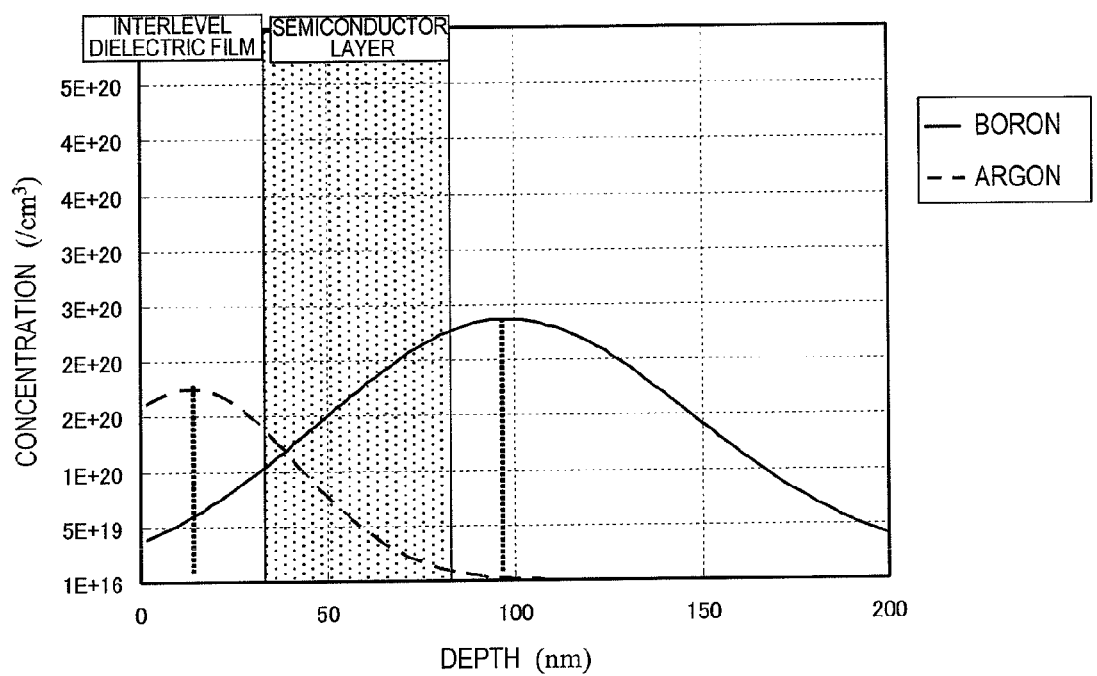
FIG. 13 illustrates the concentration profiles of boron and argon atoms that have been introduced into the source/drain regions of a thin-film transistor according to a fifth preferred embodiment of the present invention.

The concentration profiles in the depth direction of boron and argon added during this doping process step are shown in FIG. 13. As can be seen from FIG. 13, the peak depth Rp1 of boron is located at a depth (i.e., an implant depth) of approximately 95 nm under the upper surface of the interlevel dielectric film, which corresponds to a depth of approximately 15 nm over the lower surface of the semiconductor layer. Thus, the boron concentration has a profile that increases continuously from the upper surface of the semiconductor layer toward the lower surface thereof. On the other hand, the argon concentration has a peak Rp2 inside the interlevel dielectric film and decreases continuously from the upper surface of the semiconductor layer toward the lower surface thereof as in the third preferred embodiment described above.

Thereafter, a heat treatment process (i.e., an activating annealing process) is carried out as in the third preferred embodiment described above. The source/drain regions thus defined had a sheet resistance of about 0.5 to 0.8 kΩ/□. When the conventional process was performed just as described above except that argon ions were not implanted, the source/drain regions had a sheet resistance of approximately 1.5 to 2.0 kΩ/□. Thus, it can be seen that according to this preferred embodiment, the sheet resistance could be reduced to approximately one third to one half compared to the conventional process.

In this preferred embodiment, the process step of adding boron is carried out earlier than the process step of adding argon. However, the process step of adding argon may be performed earlier than the process step of adding boron. Also, in the preferred embodiment described above, ions of argon (Ar) are implanted. Alternatively, krypton (Kr) or xenon (Xe) may be used instead.

Embodiment 6

Hereinafter, a semiconductor device including a thin-film transistor that has been fabricated by the method of any of the preferred embodiments of the present invention described above will be described as a sixth specific preferred embodiment of the present invention. FIGS. 14(A) and 14(B) are block diagrams illustrating configurations for semiconductor devices according to this preferred embodiment.

FIG. 14(A) is a block diagram illustrating a display device including circuits that are arranged to carry out analog driving. The display device shown in FIG. 14(A) includes a source driver 90, a pixel section 91 and a gate driver 92. In this description, the source driver and the gate driver will be collectively referred to herein as "driver circuitry".

The source driver 90 includes a shift register 90a, a buffer 90b and a sampling circuit (transfer gate) 90c. On the other hand, the gate driver 92 includes a shift register 92a, a level shifter 92b and a buffer 92c. In this preferred embodiment, the pixel section 91 is comprised of multiple pixels, each of which includes the thin-film transistor described above.

If necessary, another level shifter may be further arranged between the sampling circuit and the shift register. Also, although not shown, another gate driver may be provided on the other side of the pixel section 91 opposite to the gate driver 92.

FIG. 14(B) is a block diagram illustrating a display device including circuits that are arranged to carry out digital driving. The display device shown in FIG. 14(B) includes a source driver 93, a pixel section 94 and a gate driver 95. To get digital driving done, the sampling circuit may be replaced with latches (A) 93b and (B) 93c as shown in FIG. 14(B). The source driver 93 includes a shift register 93a, latches (A) and (B) 93b, 93c, a D/A converter 93d, and a buffer 93e. If necessary, a level shifter may be added between the latch (B) 93c and the D/A converter 93d. On the other hand, the gate driver 95 includes a shift register 95a, a level shifter 95b and a buffer 95c.

Figure 14:
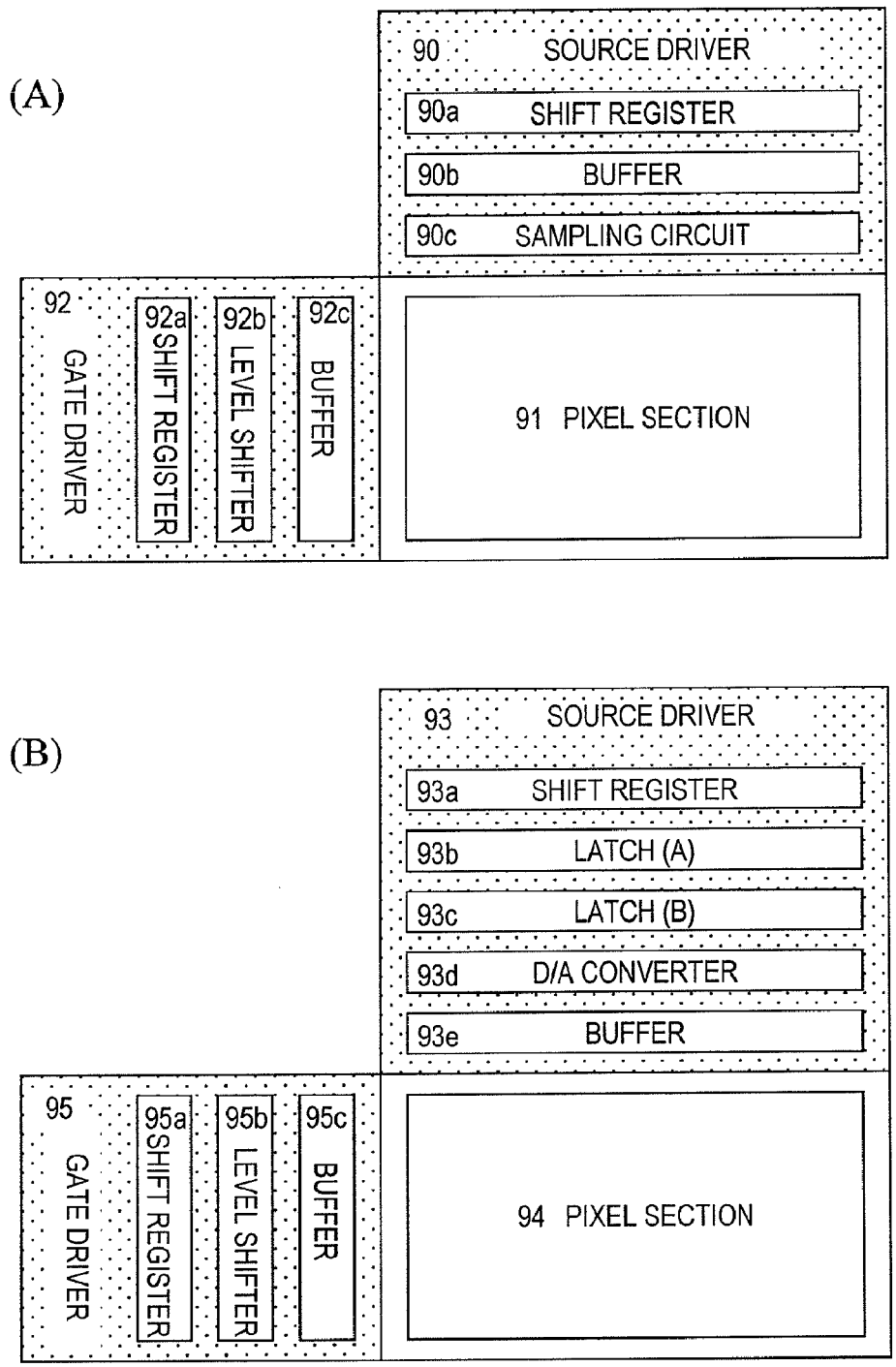
FIGS. 14(A) and 14(B) are block diagrams illustrating semiconductor device according to a sixth preferred embodiment of the present invention.

Such an arrangement can be fabricated by the manufacturing process that has already been described for the first through fifth preferred embodiments of the present invention. Also, although the configurations of the pixel section and driver circuitry are shown in FIG. 14, a memory or a microprocessor can also be formed by the manufacturing process of the present invention.

Embodiment 7

A CMOS circuit or a pixel section obtained by carrying out the present invention may be used in an electronic device such as an active-matrix-addressed LCD or in any electronic appliance in general that use such an electronic device in its display section.

Examples of those electronic appliances include camcorders, digital cameras, (rear or front) projectors, head amount displays (goggle displays), personal computers, and mobile telecommunications devices (such as mobile computers, cellphones and electronic books).

As can be seen, the present invention is applicable to such a broad range and can be used in almost any electronic appliance in every field. Such an electronic appliance according to this preferred embodiment can be implemented as a set of semiconductor devices of any of the first through sixth preferred embodiments of the present invention described above or a combination thereof.

While the present invention has been described with respect to preferred embodiments thereof, the present invention is in no way limited to those specific preferred embodiments. But the disclosed invention may be modified in numerous ways and may assume many embodiments other than the ones specifically described above.

INDUSTRIAL APPLICABILITY

The present invention is applicable broadly to any type of semiconductor device including a thin-film transistor that uses a crystalline semiconductor layer as its active regions. And the present invention can be used particularly effectively in an active-matrix-addressed LCD, an organic EL display device, a close contact image sensor, and a three-dimensional IC, among other things.

The invention claimed is:

1. A semiconductor device with at least one thin-film transistor comprising:
    a substrate;
    a crystalline semiconductor layer, which has been formed on the substrate to include a region to be a channel region, a source region and a drain region;
    a gate electrode for controlling the conductivity of the region to be a channel region;
    a gate insulating film arranged between the semiconductor layer and the gate electrode; and
    a source electrode and a drain electrode, which are connected to the source and drain regions, respectively,
    wherein at least one of the source and drain regions contains an element to be a donor or an acceptor and a rare-gas element, and
    wherein the region to be a channel region does not contain the rare-gas element, and
    wherein the atomic weight of the rare-gas element is greater than that of the element to be a donor or an acceptor, and
    wherein the concentration of the rare-gas element in the at least one region as measured in the thickness direction thereof decreases continuously from the upper surface of the at least one region toward its lower surface.

2. The semiconductor device of claim 1, wherein the concentration profile of the element to be a donor or an acceptor in the thickness direction of the at least one region has a peak within the semiconductor layer.

3. The semiconductor device of claim 2, wherein the concentration of the element to be a donor or an acceptor is higher at the lower surface of the at least one region than at the upper surface thereof.

4. The semiconductor device of claim 1, wherein the concentration of the element to be a donor or an acceptor in the thickness direction of the at least one region increases continuously from the upper surface of the at least one region toward its lower surface.

5. The semiconductor device of claim 1, wherein the gate electrode is arranged over the semiconductor layer with the gate insulating film interposed between them, and
    wherein a portion of the gate insulating film, which is located over the at least one region, contains the rare-gas element, and
    wherein the concentration profile of the rare-gas element in the thickness direction of the gate insulating film and the at least one region has a peak within the gate insulating film.

6. The semiconductor device of claim 1, wherein the gate electrode is arranged between the substrate and the semiconductor layer, and
    wherein the device further includes an interlevel dielectric film over the semiconductor layer, and
    wherein a portion of the interlevel dielectric film, which is located over the at least one region, contains the rare-gas element, and
    wherein the concentration profile of the rare-gas element in the thickness direction of the interlevel dielectric film and the at least one region has a peak within the interlevel dielectric film.

7. The semiconductor device of claim 1, wherein the rare-gas element includes one or more elements that are selected from the group consisting of Ar, Kr and Xe.

8. The semiconductor device of claim 7, wherein the rare-gas element includes argon.

9. The semiconductor device of claim 1, wherein the element to be a donor or an acceptor is a donor, which belongs to Group 5b of the periodic table and which includes a dopant element that produces n-type conduction.

10. The semiconductor device of claim 1, wherein the element to be a donor or an acceptor is an acceptor, which belongs to Group 3b of the periodic table and which includes a dopant element that produces p-type conduction.

11. The semiconductor device of claim 10, wherein the acceptor includes boron.

12. The semiconductor device of claim 1, wherein the at least one thin-film transistor includes a p-channel thin-film transistor and an n-channel thin-film transistor.

13. The semiconductor device of claim 1, further comprising an additional thin-film transistor on the substrate,
    wherein neither the source region nor the drain region of the additional thin-film transistor contains the rare-gas element.

14. The semiconductor device of claim 13, wherein the at least one thin-film transistor includes a p-channel thin-film transistor, and
    wherein the additional thin-film transistor includes an n-channel thin-film transistor.

15. A method for fabricating a semiconductor device with a thin-film transistor, the method comprising the steps of:
    (a) providing a substrate on which at least one semiconductor layer, including a crystalline region, has been formed;
    (b) adding an element to be a donor or an acceptor to at least one of two regions of the semiconductor layer that will be source and drain regions of the thin-film transistor; and
    (c) adding a rare-gas element, of which the atomic weight is greater than that of the element to be a donor or an acceptor, to the at least one region,
    wherein the method further includes the step of forming an insulating film that covers the semiconductor layer before the step (c), and
    wherein the step (c) includes adding the rare-gas element to the insulating film and the at least one region from over the insulating film so that the rare-gas element will have a higher concentration at the upper surface of the at least one region than at the lower surface thereof.

16. The method of claim 15, wherein the step (c) includes decreasing the degree of crystallinity of the at least one region, and
    wherein the method further comprises the step (d) of subjecting the substrate to a heat treatment, thereby activating the element to be a donor or an acceptor that has been added to the at least one region and re-crystallizing the at least one region, after the steps (b) and (c) have been performed.

17. The method of claim 15, wherein the step (c) includes adding the rare-gas element so that the concentration of the rare-gas element in the at least one region decreases continuously in the thickness direction thereof from the upper surface of the at least one region toward its lower surface.

18. The method of claim 15, wherein the step (c) includes adding the rare-gas element so that the concentration profile of the rare-gas element in the thickness direction of the insulating film and the at least one region has a peak within the insulating film.

19. The method of claim 18, wherein the step (c) includes adding argon to the at least one region at an acceleration voltage of x keV, where the acceleration voltage x and the thickness y (nm) of the insulating film satisfy the inequality y>1.09x+5.24.

20. The method of claim 15, wherein the steps (b) and (c) are carried out so that a peak depth Rp1 of the concentration profile of the rare-gas element becomes shallower than a peak depth Rp2 of the concentration profile of the element to be a donor or an acceptor.

21. The method of claim 15, wherein the step (b) includes adding the element to be a donor or an acceptor so that the concentration profile of the element to be a donor or an acceptor in the thickness direction of the at least one region has a peak within the semiconductor layer.

22. The method of claim 15, further comprising, after the step of forming an insulating film that covers the semiconductor layer has been performed, the step of forming a gate electrode on the insulating film.

23. The method of claim 15, wherein the step (a) includes the steps of:
   forming a gate electrode on the substrate;
   depositing a gate insulating film over the gate electrode; and
   stacking the semiconductor layer on the gate insulating film.

24. The method of claim 15, wherein the step (b) is carried out before the step (c).

25. The method of claim 15, wherein the step (c) is carried out before the step (b).

26. The method of claim 15, wherein the steps (b) and (c) are carried out simultaneously by performing the same ion doping process.

27. The method of claim 26, wherein the same ion doping process includes implanting dopant ions of the element to be a donor or an acceptor and the rare-gas element into the at least one region with the same acceleration energy.

28. The method of claim 15, wherein the at least one semiconductor layer includes a first semiconductor layer to be the active layer of a p-channel thin-film transistor and a second semiconductor layer to be the active layer of an n-channel thin-film transistor, and
   wherein the step (b) includes the steps of:
   adding an element to be an acceptor to at least one of two regions of the first semiconductor layer that will be source and drain regions; and
   adding an element to be a donor to at least one of two regions of the second semiconductor layer that will be source and drain regions,
   wherein the step (c) includes adding the rare-gas element to the at least one region of the first semiconductor layer and the at least one of the second semiconductor layer at the same time.

29. An electronic device comprising the semiconductor device of claim 1.

30. The electronic device of claim 29, comprising a display section that includes the semiconductor device.

* * * * *